(12) United States Patent
Wada et al.

(10) Patent No.: US 6,916,686 B2
(45) Date of Patent: Jul. 12, 2005

(54) METHOD OF MANUFACTURING A SEMICONDUCTOR DEVICE

(75) Inventors: Takashi Wada, Kodaira (JP); Kazunari Suzuki, Tokyo (JP); Chuichi Miyazaki, Akishima (JP); Toshihiro Shiotsuki, Higashimurayama (JP); Tomoko Higashino, Tokyo (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 45 days.

(21) Appl. No.: 10/342,238

(22) Filed: Jan. 15, 2003

(65) Prior Publication Data

US 2003/0153127 A1 Aug. 14, 2003

(30) Foreign Application Priority Data

Feb. 8, 2002 (JP) ........................................ 2002-031722

(51) Int. Cl.$^7$ .......................... H01L 21/44; H01L 21/48; H01L 21/50
(52) U.S. Cl. .......................... 438/118; 438/15; 438/106; 438/127
(58) Field of Search .......................... 438/15, 106, 115, 438/118, 127

(56) References Cited

U.S. PATENT DOCUMENTS

| | | | | |
|---|---|---|---|---|
| 4,675,985 A | * | 6/1987 | Goto | 156/331.1 |
| 4,744,550 A | * | 5/1988 | Oglesbee | 269/21 |
| 4,796,078 A | * | 1/1989 | Phelps et al. | 257/668 |
| 5,356,949 A | * | 10/1994 | Komiyama et al. | 522/102 |
| 5,411,921 A | * | 5/1995 | Negoro | 438/118 |
| 5,641,714 A | * | 6/1997 | Yamanaka | 438/14 |
| 5,776,799 A | * | 7/1998 | Song et al. | 438/118 |
| 5,888,882 A | * | 3/1999 | Igel et al. | 438/460 |
| 5,888,883 A | * | 3/1999 | Sasaki et al. | 438/460 |
| 6,004,867 A | * | 12/1999 | Kim et al. | 438/459 |
| 6,039,833 A | * | 3/2000 | Freund et al. | 156/344 |
| 6,043,109 A | * | 3/2000 | Yang et al. | 438/113 |
| 6,083,811 A | * | 7/2000 | Riding et al. | 438/460 |
| 6,111,247 A | * | 8/2000 | Sengupta | 250/226 |
| 6,121,118 A | * | 9/2000 | Jin et al. | 438/460 |
| 6,297,076 B1 | * | 10/2001 | Amagai et al. | 438/114 |
| 6,297,131 B1 | * | 10/2001 | Yamada et al. | 438/464 |
| 6,337,221 B1 | * | 1/2002 | Kim et al. | 438/15 |
| 6,555,418 B2 | * | 4/2003 | Kurosawa et al. | 438/118 |
| 6,558,975 B2 | * | 5/2003 | Sugino et al. | 438/64 |
| 6,562,640 B1 | * | 5/2003 | Tseng et al. | 438/15 |
| 6,589,801 B1 | * | 7/2003 | Yoon et al. | 438/15 |
| 6,607,938 B2 | * | 8/2003 | Kwon et al. | 438/109 |
| 6,661,080 B1 | * | 12/2003 | Glenn et al. | 257/620 |
| 2001/0051394 A1 | * | 12/2001 | Kim et al. | 438/106 |
| 2003/0190795 A1 | * | 10/2003 | Kawakami | 438/462 |

* cited by examiner

*Primary Examiner*—Richard Elms
*Assistant Examiner*—Michael K. Luhrs
(74) *Attorney, Agent, or Firm*—Reed Smith LLP; Stanley P. Fisher, Esq.; Juan Carlos A. Marquez, Esq.

(57) ABSTRACT

A contact collect is provided to prevent damage to the top surface of a semiconductor chip at the time of die bonding the semiconductor chip. A protection tape is pasted to the top surface of the semiconductor chip before die bonding of the semiconductor chip is executed by pressing the back surface (underside) of the semiconductor chip sucked and securely held by the contact collect against respective chip-mounting regions of a multi-wiring board. The contact collect is, for example, substantially cylidrical in outside shape, and a bottom part (suction head) thereof is made of soft synthetic rubber, etc. The protection tape pasted to the top surface of the semiconductor chip prevents the top surface of the semiconductor chip from directly contacting with the contact collect even at the time of vacuum suction by pressing the suction head of the contact collect against the top surface of the semiconductor chip.

17 Claims, 29 Drawing Sheets

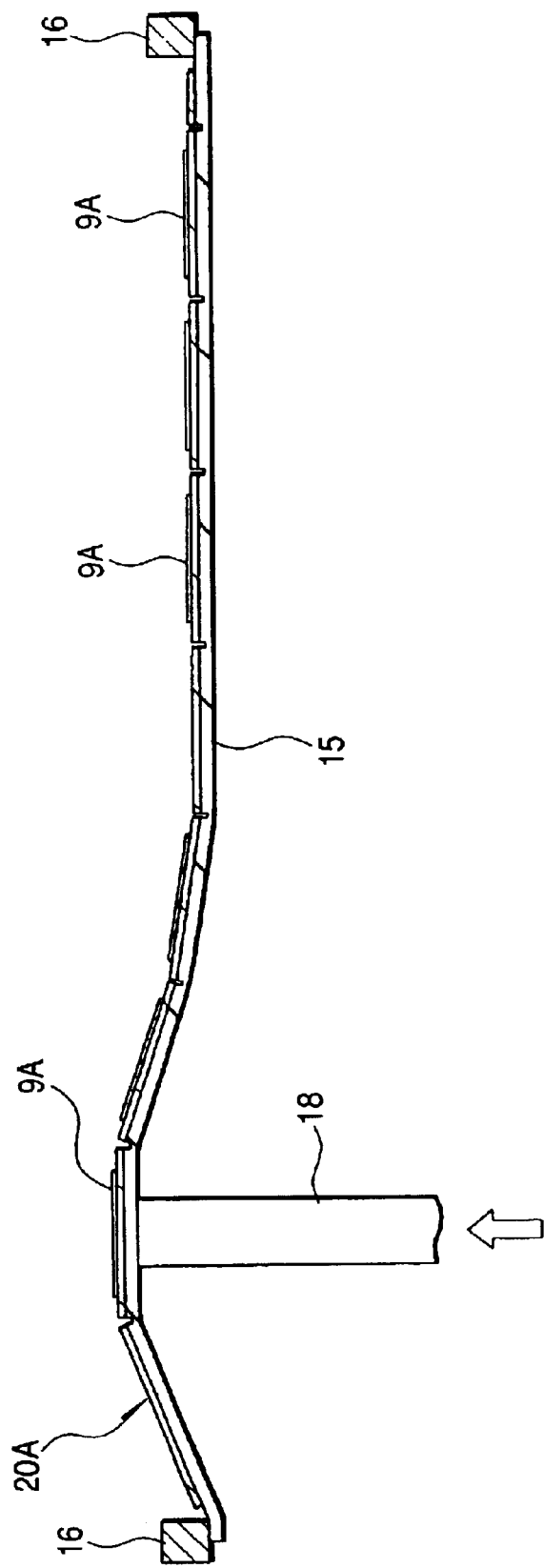

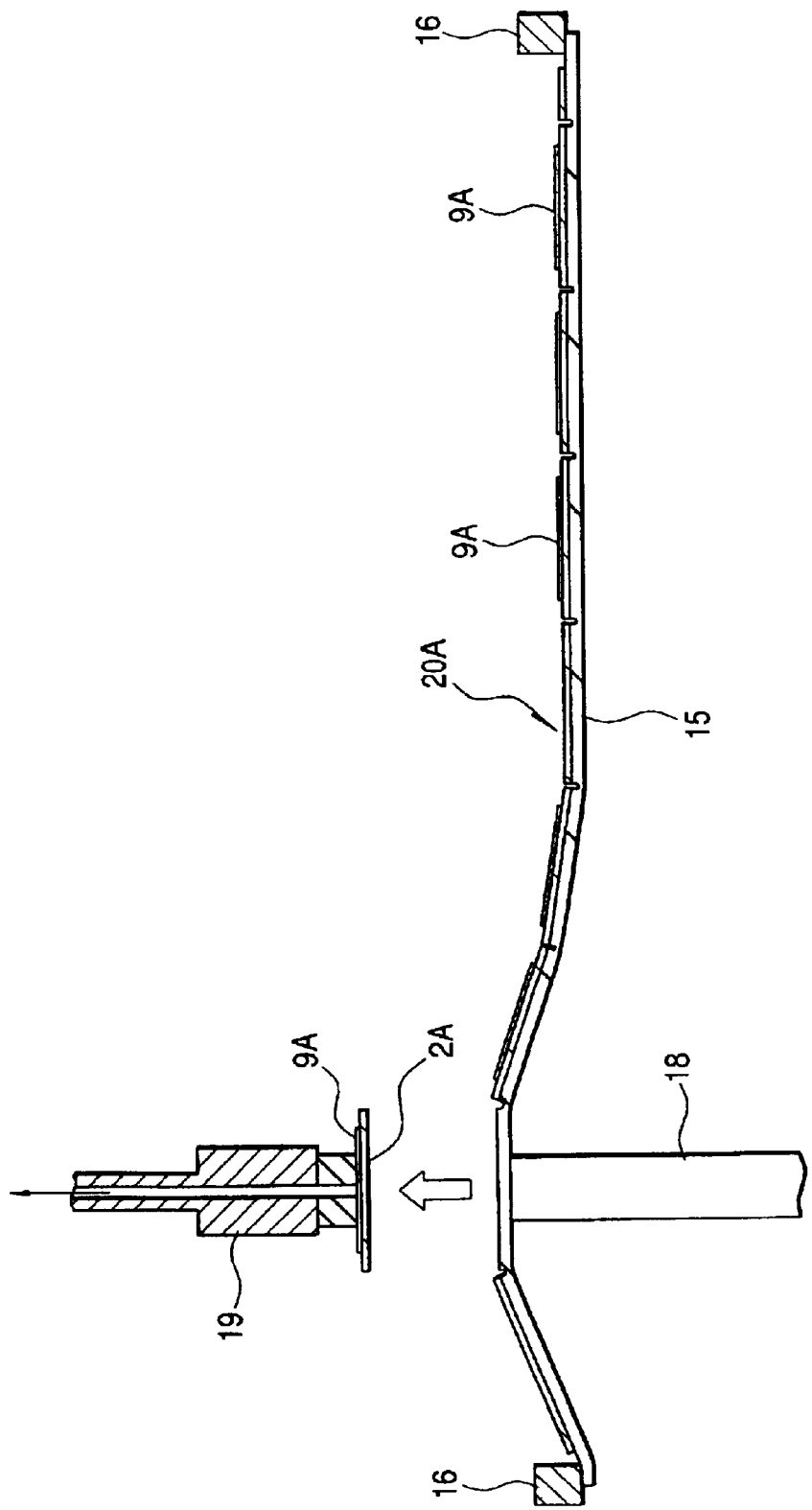

FIG. 12(a)
FIG. 12(b)
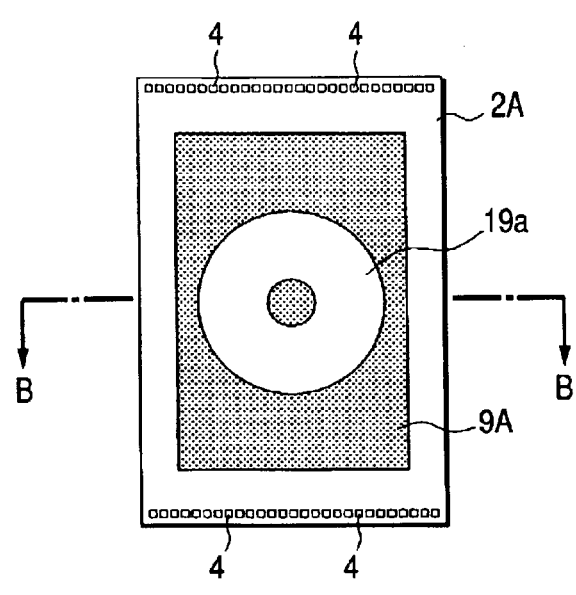
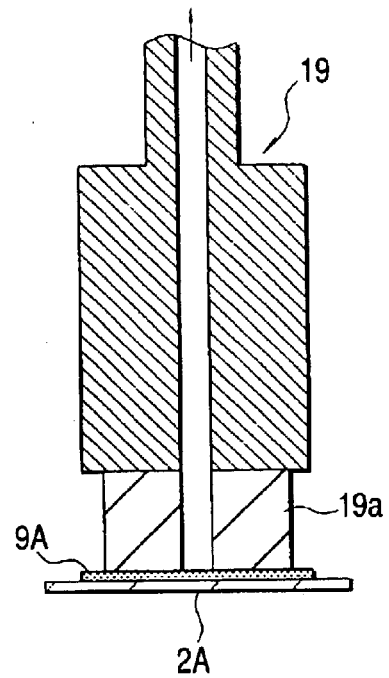

METHOD OF MANUFACTURING A SEMICONDUCTOR DEVICE

BACKGROUND OF THE INVENTION

The invention relates to techniques for manufacturing semiconductor devices, and in particular, to an effective technique when applied to a method of manufacturing a semiconductor device, including the step of die bonding semiconductor chips with integrated circuits formed thereover to a wiring board or a lead frame.

In the step of assembling a semiconductor device, work is carried out such that semiconductor chips (hereinafter referred to merely as chips) are first separated into pieces by dicing a semiconductor wafer with integrated circuits formed thereover, die bonding of the respective chips to the surface of a wiring board or a lead frame is then executed, and subsequently, wire bonding of the respective chips to the wiring board or the lead frame is executed with an Au wire and so forth.

More specifically, a dicing tape is first pasted to the back surface of the semiconductor wafer after completion of a wafer preparation step (front-end step) and a wafer inspection step, and subsequently, the chips are separated into pieces by dicing the semiconductor wafer with a diamond blade and so forth. At this point in time, the dicing tape is not completely cut up, thereby retaining the respective chips separated into pieces as they are on the dicing tape.

Thereafter, the chips are thrust up one by one from the back surface side of the dicing tape by use a pin, and the respective chips are peeled off from the dicing tape by securely holding the surface of the respective chips as thrust up through vacuum suction with a collet to be subsequently transferred to a die bonding step where the wiring board or the lead frame has already been prepared. The chips sucked and securely held by the collect, respectively, are pressed against chip-mounting regions of the wiring board or the lead frame, and the die bonding of the chips is implemented by heating and curing an adhesive that is applied to the chip-mounting regions beforehand, such as silver (Ag) paste, an organic resin, and so forth.

Following the above step, wire bonding is implemented between bonding pads of the respective chips and conductor layers of the wiring board (or inner leads of the lead frames), and subsequently, the chips are sealed with a molding resin or potting resin, thereby substantially completing assembling

SUMMARY OF THE INVENTION

In the above-described step of assembling the semiconductor device, the inventor, et al. have executed transfer of a chip by use of a collet called the inverted pyramidal collet. The inverted pyramidal collet is structured such that the bottom surface thereof is brought into contact with the periphery of the upper surface of the chip so as to enable the chip kept in such a state to be sucked and securely held by effecting vacuum suction thereof.

However, due to advances being made towards further reduction in the thickness of chips following, for example, recent introduction of a multi-chip packaging structure where a plurality of chips as stacked are mounted, there has since arisen a situation in which transfer of the chip with the inverted pyramidal collet has become difficult to execute. For example, at the time of die bonding by pressing the chip securely held and retained by the inverted pyramidal collet through vacuum suction to a chip-mounting region of the wiring board, the lower edge of the inverted pyramidal collet comes into contact with the wiring board prior to the chip coming into contact therewith if the chip is thin in thickness, thereby creating a miniscule gap between the inverted pyramidal collet and the periphery of the chip. As a result, a portion of an adhesive applied beforehand to the chip-mounting region of the wiring board creeps over the top surface of the chip positioned on the negative pressure side through the gap, thereby causing occurrence of such a problems as to cover up bonding pads formed over the top surface of the chip.

Accordingly, the inventor, et al. have studied on introduction of a contact collect provided with a suction head smaller in diameter than the chip, for use as a collet capable of sucking and securely holding a thin chip. Since the contact collect is structured so as to effect vacuum suction while keeping the suction head in intimate contact with the top surface of a chip, sucking and securely holding of the chip can be ensured regardless of the thickness of the chip.

With the contact collect, however, the suction head thereof comes in direct contact with the top surface, that is, the integrated circuit formation surface, of the chip, and consequently, there is a possibility of the top surface being marred at the time of die bonding, and so forth. The top surface of the chip is normally protected by a protection film (insulating film) made of an organic material such as a polyimide resin, and so forth, applied to the topmost layer of the top surface, however, if a chip with a minute foreign matter adhered to the top surface thereof is sucked and securely held by the contact collect, and die bonding is executed by pressing the chip in such a state against the top surface of the wiring board and so forth, this can raise a possibility of the foreign matter penetrating through the protection film due to the pressure of the contact collect, thereby damaging the circuits, and causing occurrence of faulty operation at times.

Further, openings are selectively formed in the protection film (insulating film), made of the polyimide resin, and so forth, by photolithographic and etching techniques in order to expose bonding pads that are external terminals of the chip.

Meanwhile, due to advances in multifunctionality as well as higher density of integrated circuits, there has been seen a tendency of the bonding pads being formed with narrower pitches, and in such a case, there is the need of reducing the thickness of the protection film (insulating film) made of the polyimide resin, and so forth in order to define the opening for the respective bonding pads with high reliability. Accordingly, there is a higher probability of the circuits being damaged, thereby causing occurrence of faulty operation.

Further, there are also cases where the protection film (insulating film) made of the polyimide resin, and so forth is omitted in order to reduce the cost of manufacturing a semiconductor chip, and the surface protection of the semiconductor chip is provided only with an inorganic insulating film such as a silicon oxide film, silicon nitride film, and so forth. In such a case, however, there is a still higher probability of the circuits being damaged, thereby causing occurrence of faulty operation.

It is conceivable as one of countermeasures for overcoming the problems described above to buffer the pressure of the contact collet, applied to the top surface of the chip at the time of die bonding, by forming the suction head of the contact collect of a soft material such as a synthetic rubber.

Such a countermeasure as described above has also an advantageous effect of reducing the manufacturing cost of the contact collet since the synthetic rubber is material available at a low cost. However, the countermeasure as described above whereby the suction head of the contact collect is formed of the synthetic rubber is not preferable because a foreign matter adhered to the top surface of the chip is transferred to the suction head, thereby raising the risk of the top surfaces of succeeding chips being marred one after another.

On the other hand, in the case of forming the suction head of the contact collect of a hard material such as ceramic and so forth, it becomes harder for a foreign matter over the top surface of the chip to be transferred to the suction head, but in case that a foreign matter remains adhered to the top surface of the chip, the foreign matter will mar the top surface of the chip with certainty at the time of die bonding. Furthermore, this case is disadvantageous in that the manufacturing cost of the contact collet goes up since ceramic is a fairly more expensive material than the synthetic rubber.

It is therefore an object of the invention to provide a technique for preventing damage occurring to the top surface of a chip at the time of die bonding of the chip by use of a contact collet.

Another object to the invention is to provide a technique for reducing the cost of manufacturing a semiconductor device wherein die bonding of a chip is executed by use of a contact collet.

The above-described objects and other objects of the present invention together with novel features thereof will become apparent from the description of the specification and the accompanying drawings.

Among various embodiments of the invention as disclosed by the present application, the advantageous effect of a representative one is described in simple terms as follows.

A method of manufacturing a semiconductor device, according to the invention, comprises the steps of: separating a plurality of semiconductor chips into pieces by dicing a semiconductor wafer with the top surface thereof, partitioned into a plurality of semiconductor chip-forming regions, preparing a contact collet with a suction head coming in contact with the top surface of the respective semiconductor chips, smaller in surface area than the respective semiconductor chips, and sucking and securely holding the respective semiconductor chips separated into pieces with the contact collet by abutting the suction head of the contact collet against the top surface of the respective semiconductor chips separated into pieces, executing die bonding of the respective semiconductor chips over a mounting base by pressing the back surface of the respective semiconductor chips sucked and securely held by the contact collet against the top surface of the mounting base, and connecting bonding pads formed over the top surface of the respective semiconductor chips to conductor layers formed over the top surface of the mounting base via a wire, respectively, wherein a protection layer for preventing direct contact of the suction head of the contact collet with the top surface of the respective semiconductor chips is provided over the top surface of the respective semiconductor chips prior to sucking and securely holding the respective semiconductor chips with the contact collet.

BRIEF DESCRIPTION OF THE DRAWINGS

FIG. 10 is a sectional view showing a state where the semiconductor chips separated into pieces are thrust up one by one by use of a thrust-up pin;

FIG. 11 is a sectional view showing a state where one of the semiconductor chips separated into pieces is securely held by a contact collet through vacuum suction;

FIG. 12A is a plan view of the semiconductor chip securely held by the contact collect through vacuum suction, and FIG. 12B a sectional view thereof, taken on line B—B in FIG. 12A.

DESCRIPTION OF THE PREFERRED EMBODIMENTS

Embodiments of the invention are described in detail hereinafter with reference to the accompanying drawings. In all figures used for describing the embodiments, identical members are in principle denoted by identical reference numbers, omitting repeated description thereof.

Figure 1:
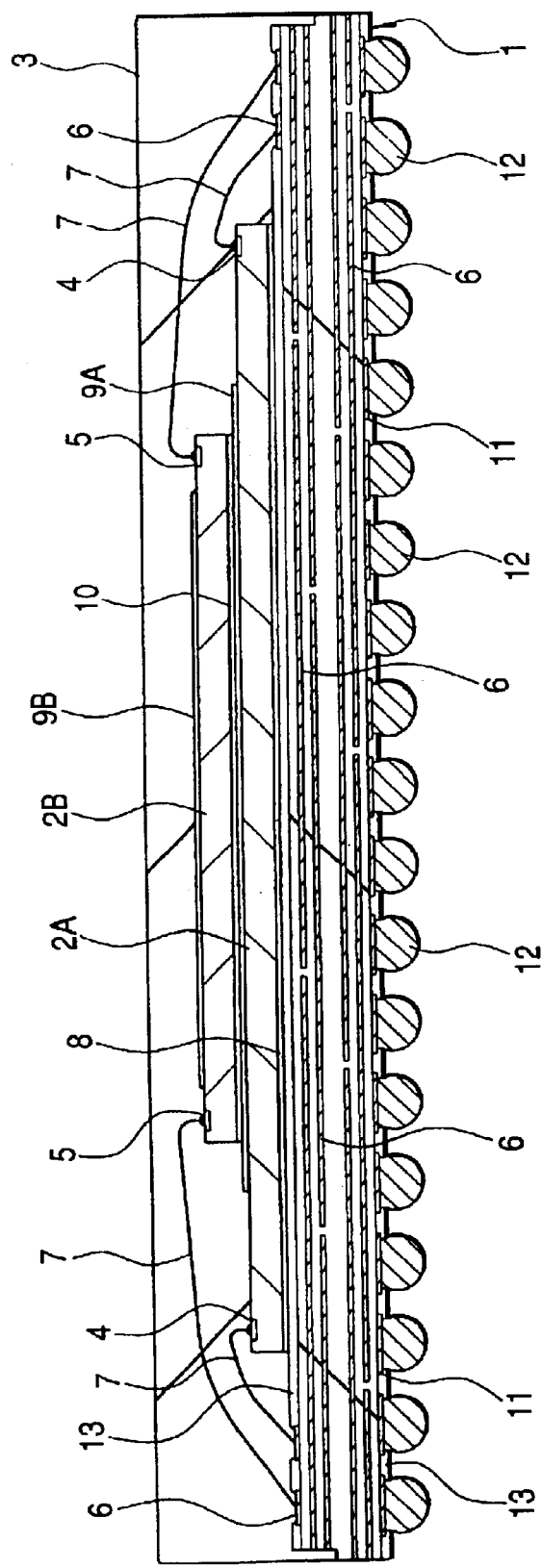
FIG. 1 is a sectional view of a semiconductor device according to one embodiment of the invention.
Figure 2:
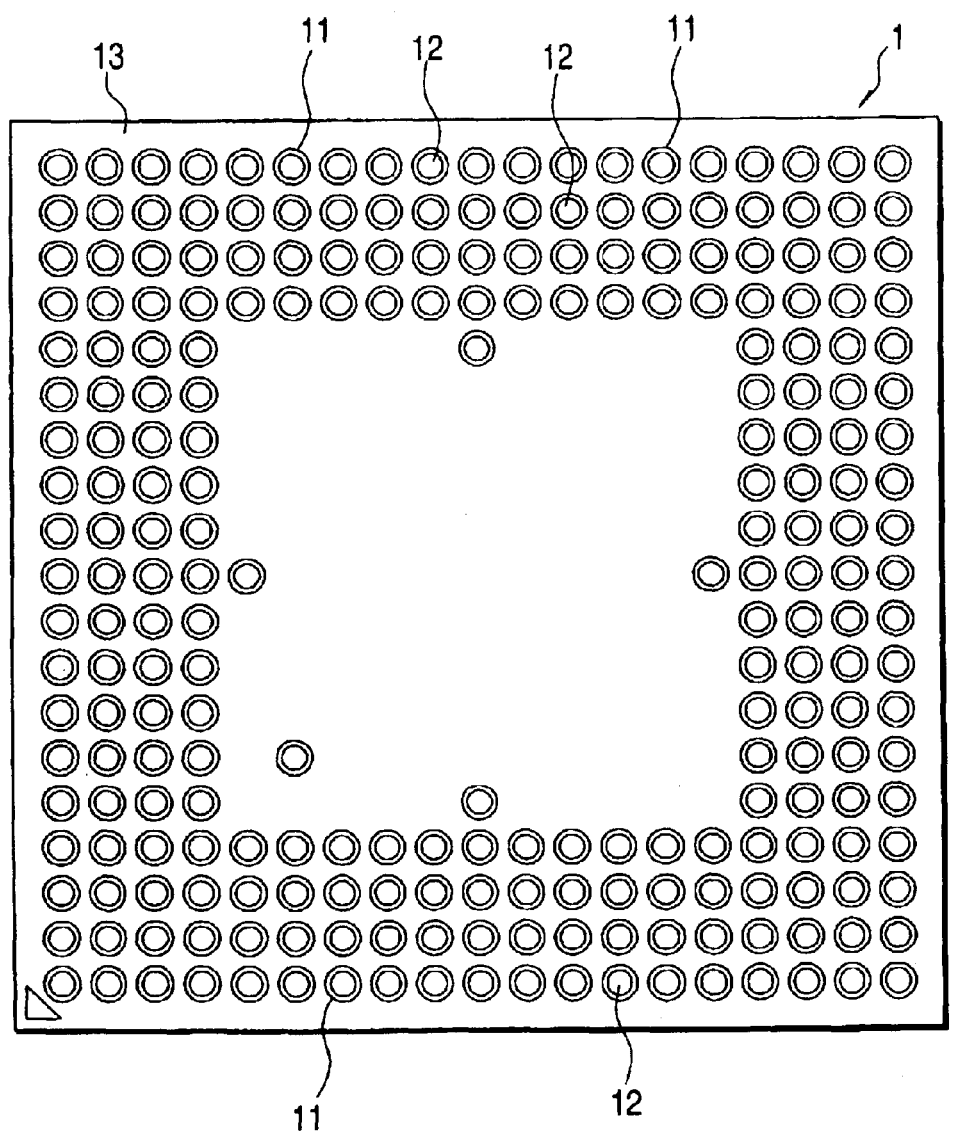
FIG. 2 is a plan view of the semiconductor device according to the embodiment of the invention.

FIG. 1 is a sectional view showing a semiconductor device according to one embodiment of the invention, and FIG. 2 is a plan view showing the back surface of the semiconductor device. The semiconductor device according to the present embodiment is a layered multi-chip module (MCM) in which two chips 2A, 2B are stacked so as to be mounted over the top surface of a package substrate (mounting base) 1, and the chips 2A, 2B are sealed with a molding resin 3.

Of the two chips 2A, 2B, the first chip 2A is mounted over the top surface of the package substrate 1, and the second chip 2B is mounted so as to overlie the first chip 2A. The first chip 2A is a silicon chip with, for example, a flash memory formed thereover, and the second chip 2B is a silicon chip with, for example, a high-speed microprocessor (MPU: microprocessor unit) formed thereover. Bonding pads 4, 5, formed so as to overlie the respective top surfaces (upper surfaces) of the chips 2A, 2B, are electrically connected to wirings 6 formed over the top surface of the package substrate 1 via an Au wire 7, respectively. That is, either of the two chips 2A, 2B is mounted over the package substrate 1 by the wire bonding method.

The first chip 2A is bonded to the top surface of the package substrate 1 with an adhesive 8 interposed therebetween. A protection tape 9A is pasted to the top surface of the first chip 2A. Meanwhile, the second chip 2B is bonded to the top surface of the first chip 2A through the intermediary of a die-bonding film 10 pasted to the back surface (underside) of the second chip 2B. Further, the top surface of the second chip 2B is coated with a protection film 9B. The protection tape 9A of the first chip 2A, and the protection film 9B of the second chip 2B are utilized for preventing the respective top surfaces of the first chip 2A and the second chip 2B from being marred when mounting the first chip 2A and the second chip 2B over the package substrate 1 as described later.

The package substrate 1 with the two chips 2A, 2B, mounted thereover is a multilayer wiring board made mainly of a general-purpose resin such as an epoxy resin containing glass fiber (glass-epoxy resin), and so forth, and is provided with the wirings 6 formed of about four layers over the top surface (upper surface) and back surface (underside), and in the interior thereof.

A plurality of electrode pads 11 electrically connected to the wirings 6, respectively, are disposed in an array fashion on the back surface of the package substrate 1, and a solder bump 12 serving as an external connection terminal of the multi-chip module (MCM) is connected to the respective electrode pads 11. The multi-chip module (MCM) is mounted on a wiring board, and so forth, of electronic equipment through the intermediary of the solder bumps 12. Further, the top surface and back surface of the package substrate 1, except the respective surfaces of the wirings 6 and the electrode pads 11, are coated with a solder resist 13 made of an epoxy resin etc., respectively.

Thus, with the multi-chip module (MCM) according to the present embodiment, the package substrate 1 is downsized by stacking the chip 2B over the chip 2A, thereby attempting to enhance mounting density.

Now, a method of manufacturing the multi-chip module (MCM) constructed as described above is described in order of processing step hereinafter with reference to FIGS. 3 to 28.

Figure 3:
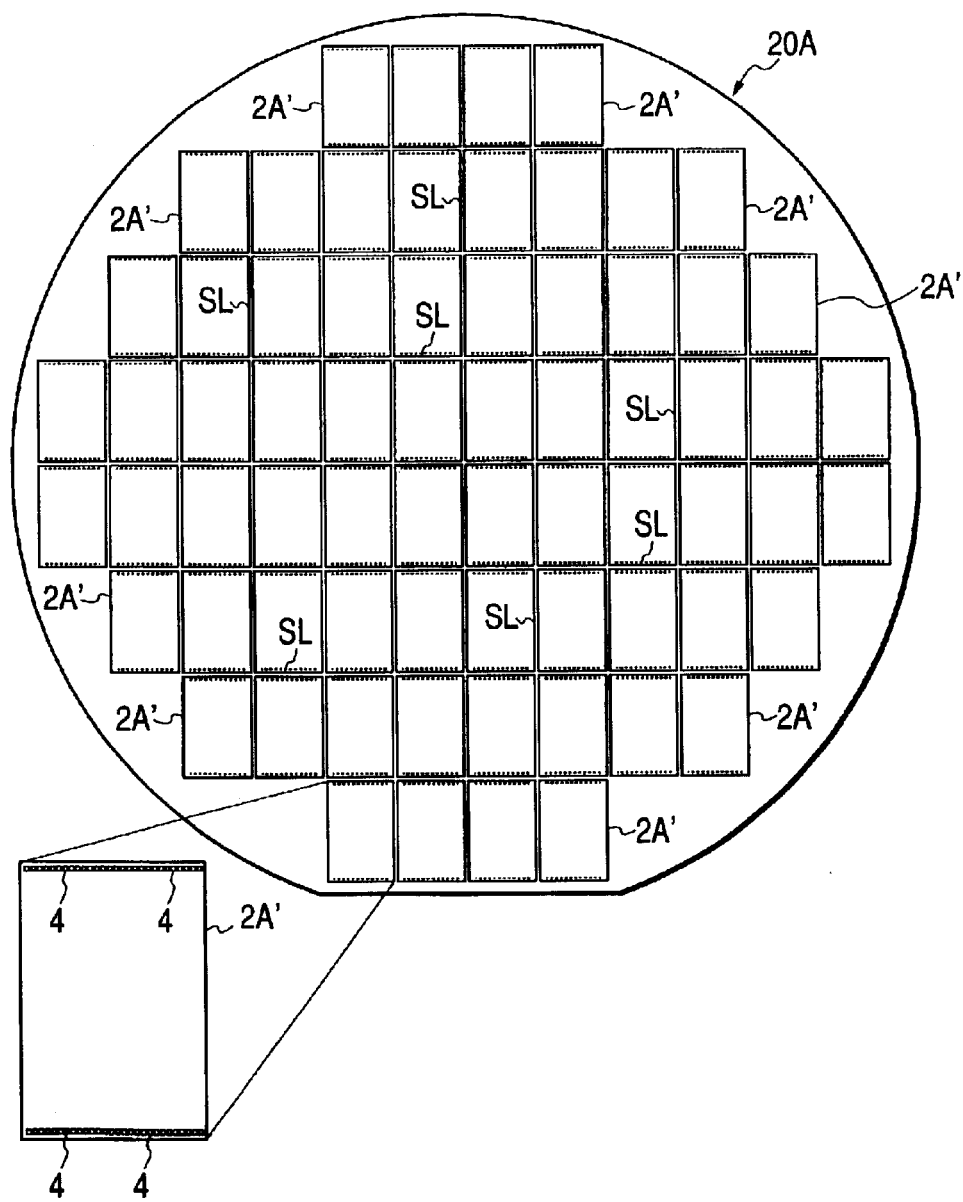
FIG. 3 is a plan view of a semiconductor wafer for use in carrying out a method of manufacturing the semiconductor device according to the embodiment of the invention.

First, flash memories are formed over the top surface of a semiconductor wafer (hereinafter referred to as wafer) 20A shown in FIG. 3 by the known process, and subsequently, wafer inspection is conducted by tapping a probe on the bonding pads 4 in each of a plurality of chip-forming regions 2A' that are partitioned by scribe lines SL, respectively, thereby sorting out defectives from conforming workpieces.

Figure 4:
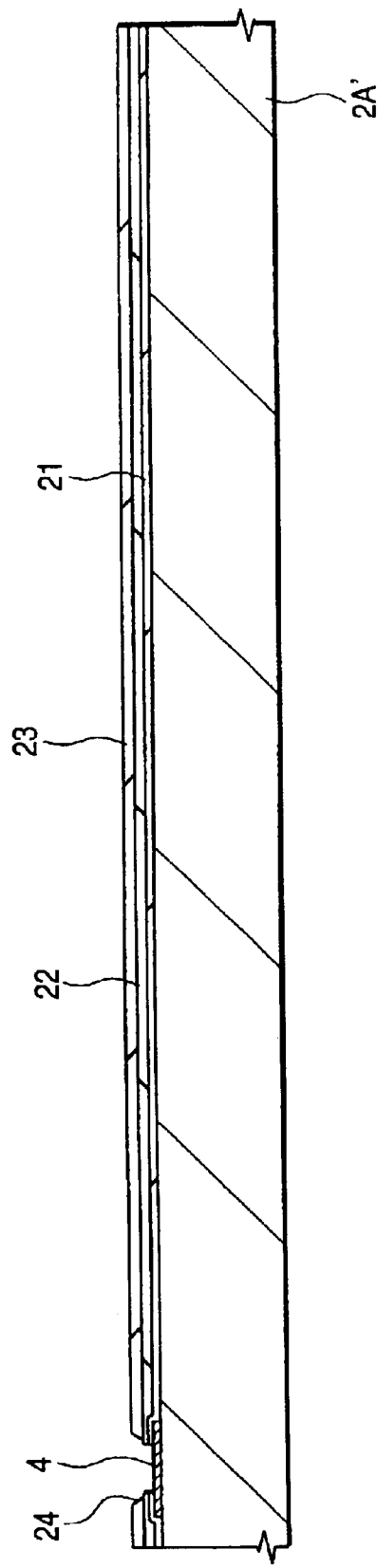
FIG. 4 is a sectional view showing the principal part of the semiconductor wafer shown in FIG. 3.

As shown in FIG. 4, over the top surface of the respective chip-forming regions 2A', there are formed a passivation film, made of a silicon oxide film 21 covering integrated circuits, and a silicon nitride film 22 formed on top of the silicon oxide film 21, and a polyimide film 23 deposited over the passivation film. The silicon oxide film 21, silicon nitride film 22, and polyimide film 23 have film thickness of, for example, 800 nm, 1100 nm, and 2.5 $\mu$m, respectively. An opening 24 for exposing the respective bonding pads 4 is defined in the silicon oxide film 21, silicon nitride film 22, and polyimide film 23, respectively.

Figure 5:
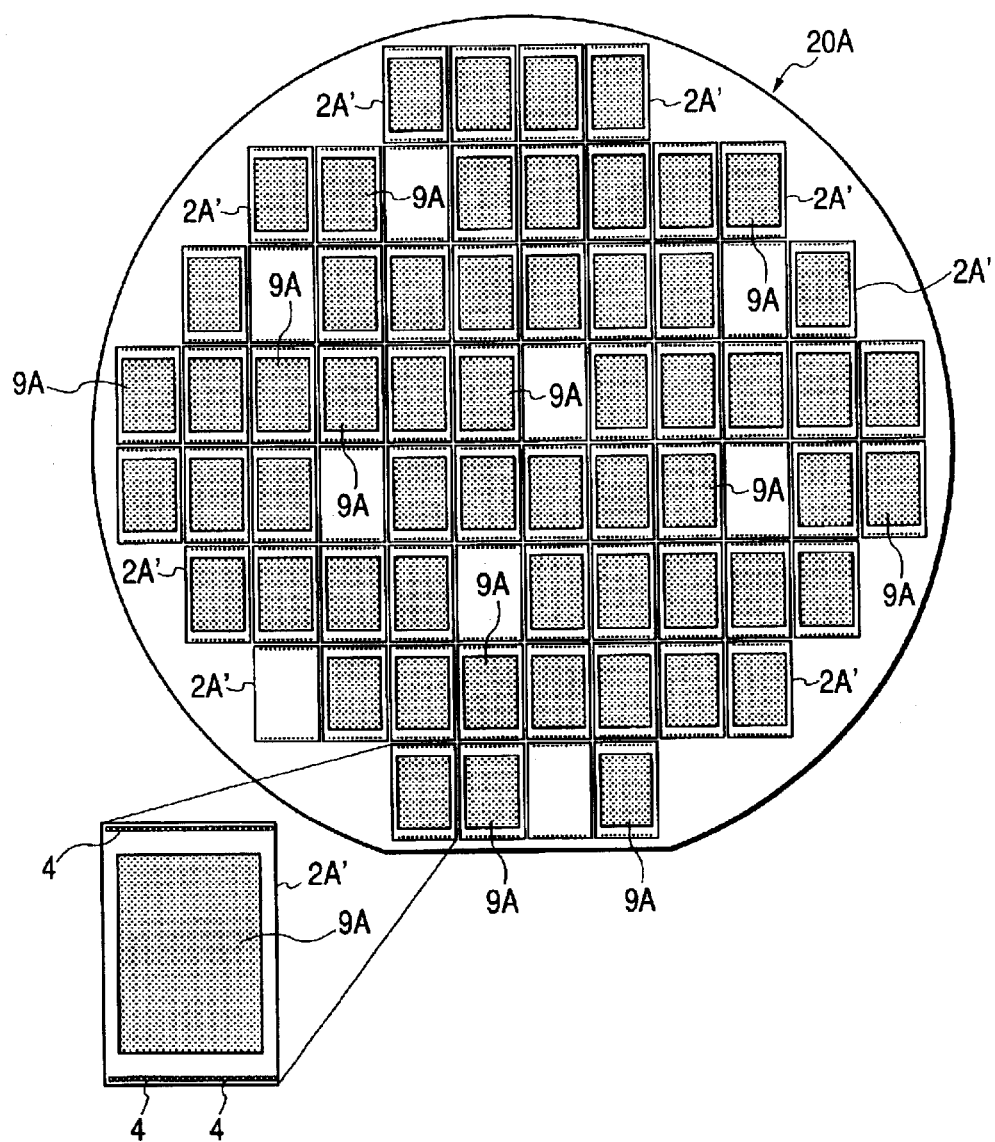
FIG. 5 is a plan view showing a state where a protection tape is pasted to the top surface of the semiconductor wafer.
Figure 6A:
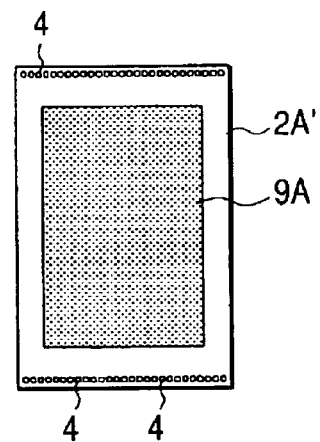
FIGS. 6A to 6C are plan views showing various shapes of the protection tape pasted to the top surfaces of the semiconductor chips, respectively.
Figure 6B:
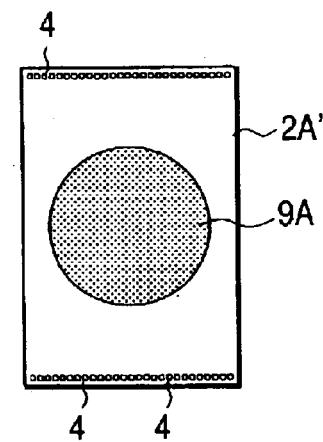
Figure 6C:
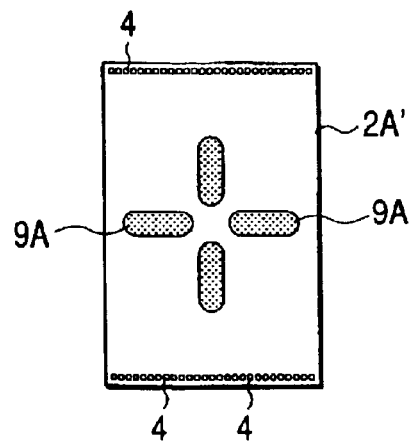

Subsequently, as shown in FIG. 5, the protection tape 9A is pasted to the top surface of the respective chip-forming regions 2A'. The protection tape 9A is provided in order to prevent a contact collet for use when transferring and die-bonding the respective chips 2A in later steps from coming in direct contact with the top surface of the respective chips 2A. The protection tape 9A may be in any shape provided that it can prevent direct contact of the contact collet with the respective chips 2A, and does not cover the surface of the respective bonding pads 4, allowing various shapes, as shown in, for example, FIGS. 6A to 6C, to be adopted. Further, as for the constituent material of the protection tape 9A, various materials may be adopted provided that the same serves the above-described purpose, and for the protection tape 9A, use is made of an insulating material such as, for example, a polyimide resin, an epoxy resin, silicone resin, bismaleimido-triazine resin, or a mixed resin made of not less than two kinds selected from the group consisting of the foregoing resins, worked into a thin film on the order of 10 to 50 $\mu$m in thickness with an adhesive coated on one side thereof. Further, if the protection tape 9A is pasted only to the top surface of the respective chip-forming regions 2A' that are determined as the conforming workpieces at the time of the wafer inspection, as shown in FIG. 5, when pasting the protection tape 9A to the top surface of the respective chips 2A, this will enable the protection tape 9A to be utilized as a mark for the conforming workpiece, so that time and effort required for separately sticking the mark for the conforming workpieces to the top surface of the respective conforming chips 2A can be eliminated. The protection tape 9A is formed to a thickness larger than that of any of the silicon oxide film 21, silicon nitride film 22, and polyimide film 23, covering the top surface of the respective chip-forming regions 2A', so as to soften the impact of the contact collect coming in contact with the respective chips 2A in later steps.

Figure 7:
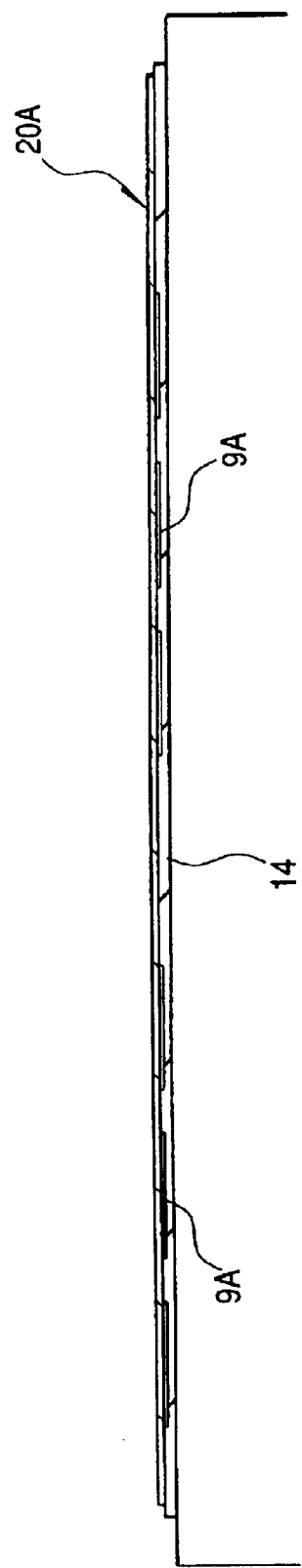
FIG. 7 is a sectional view showing the step of grinding the back surface of the semiconductor wafer.

Subsequently, as shown in FIG. 7, the back surface of the wafer 20A, with a back-grind tape 14 for protection, pasted to the top surface thereof, is ground by a grinder, and further, finishing grinding is applied thereto by wet etching, thereby reducing the thickness of the wafer 20A to about 50 to 90 μm.

Figure 8:
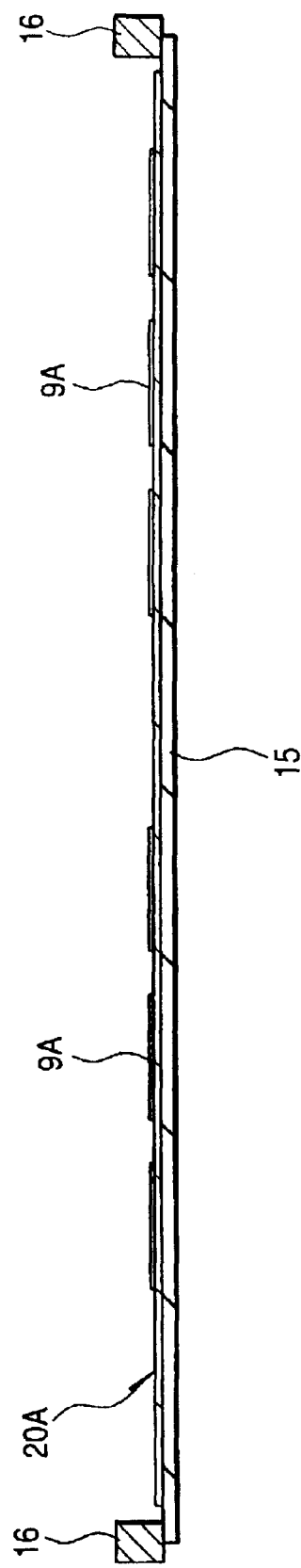
FIG. 8 is a sectional view showing a state where a dicing tape is bonded to the back surface of the semiconductor wafer and fixedly attached to a carrier jig 16.

Next, after peeling off the back-grind tape 14 from the wafer 20A, a dicing tape 15 is pasted to the back surface of the wafer 20A as shown in FIG. 8, and at the same time, the periphery of the dicing tape 15 is bonded to, and fixedly attached to a carrier jig 16.

Thus, in the case of pasting the protection tape 9A to the top surface of the wafer 20 prior to reducing the thickness thereof, it is possible to reduce the risk of occurrence of problems such as cracking of the wafer 20 at the time of pasting the protection tape 9A thereto. Further, in the case of pasting the protection tape 9A to the top surface of the wafer 20 after reducing the thickness thereof and peeling off the back-grind tape 14 therefrom, it is possible to prevent occurrence of problems such as the protection tape 9A undergoing degradation or peeling off from the wafer 20.

Figure 9:
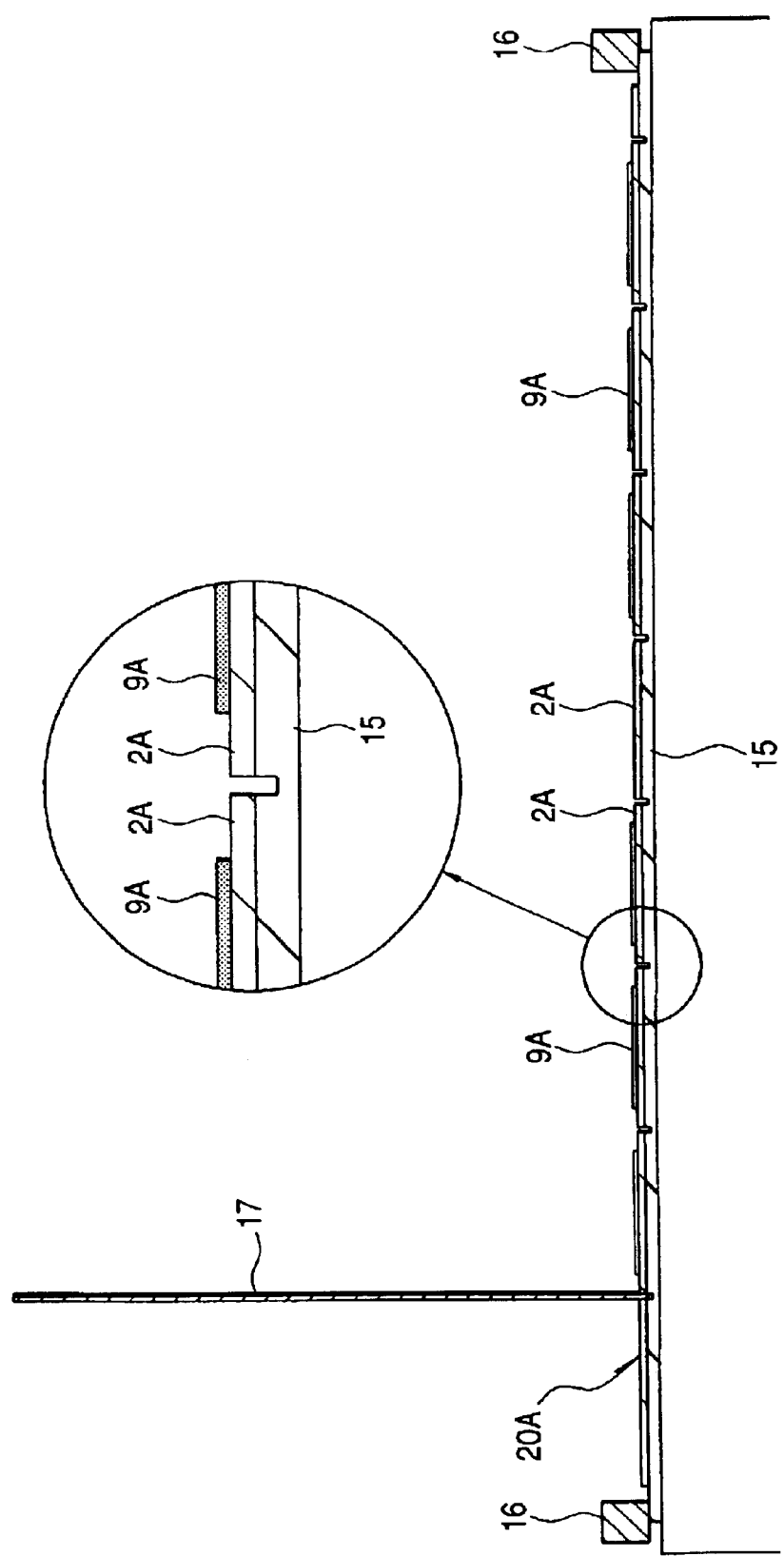
FIG. 9 is a sectional view showing the step of dicing the semiconductor wafer.

Subsequently, as shown in FIG. 9, by dicing the wafer 20A with a diamond blade 17 or the like, the chips 2A are separated into pieces. At this point in time, the dicing tape 15 is not completely cut (that is, half cut) in order to keep the respective chips 2A that are separated into pieces in a state as bonded to the dicing tape 15.

Then, upon irradiation of the dicing tape 15 with ultraviolet rays, an adhesive applied to the dicing tape 15 is cured, and tackiness of the adhesive is lowered, thereby rendering the chips 2A prone to be easily peeled off from the dicing tape 15.

Next, as shown in FIG. 10, the chips 2A are thrust up one by one from the back face side of the dicing tape 15 by use of a thrust-up pin 18, and subsequently, as shown in FIG. 11, by securely holding the top surface side of each of the chips 2A as thrust up, through vacuum suction, with a contact collet 19, the chip 2A is peeled off from the dicing tape 15. The respective chips 2A peeled off from the dicing tape 15 are sucked and securely held by the contact collect 19 to be transferred to a subsequent step of die bonding.

FIG. 12A is a plan view of the chip 2A that is securely held through vacuum suction by the contact collect 19, and FIG. 12B is a sectional view thereof, taken on line B—B in FIG. 12A. The contact collect 19 is, for example, substantially cylindrical in outside shape, and a bottom part (suction head 19a) thereof is made of a soft synthetic rubber, and so forth. Since the protection tape 9A is pasted to the top surface of the chip 2A as previously described, even if vacuum suction of the chip 2A is executed by pressing the suction head 19a of the contact collect 19 against the top surface of the chip 2A, this will not cause the top surface of the chip 2A to come into direct contact with the contact collect 19.

Figure 13:
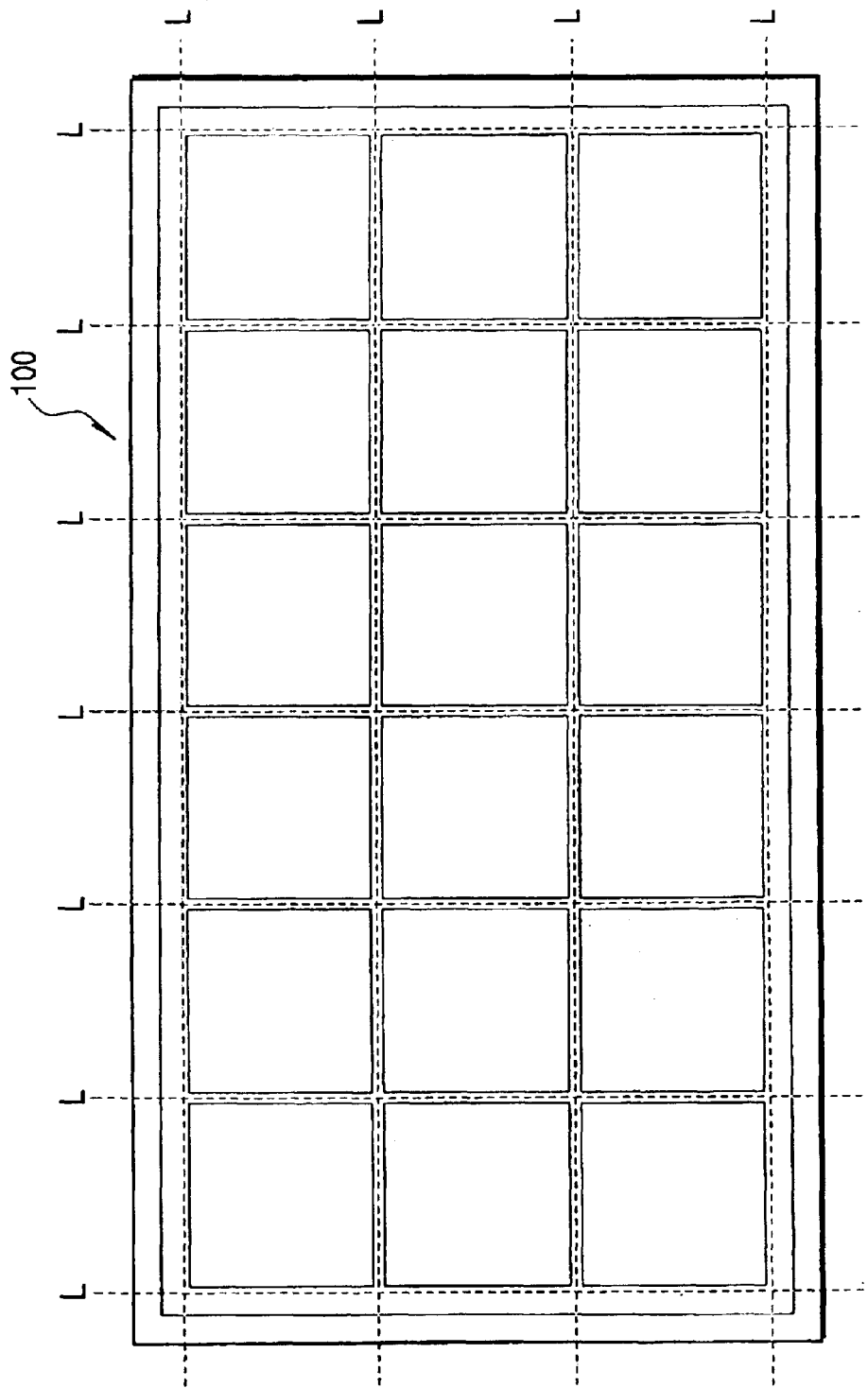
FIG. 13 is a plan view of a multi-wiring board for use in carrying out the method of manufacturing the semiconductor device according to the embodiment of the invention.

FIG. 13 is a plan view showing the entire top surface (chip-mounting surface) of a board (hereinafter referred to as multi-wiring board 100) rectangular in shape, for use in manufacturing the multi-chip module (MCM), and FIG. 14 a plan view showing the entire back surface of the multi-wiring board 100.

The multi-wiring board 100 is the board serving as a parent body for the package substrate 1 previously described. Plural units of the package substrates 1 are obtained by cutting (dicing) the multi-wiring board 100 into pieces in a grid pattern along scribe lines L shown in the figure.

In the case of the multi-wiring board 100 shown in the figure, the long side thereof is partitioned into six blocks of package board forming regions, and the short side thereof is partitioned into three blocks of the package board forming regions, so that 18 (3×6=18) units of the package boards 1 can be obtained. The wirings 6 (not shown) are formed over the top surface of the multi-wiring board 100 and in internal layers thereof, and the electrode pads 11 are formed on the back surface thereof.

Figure 15:
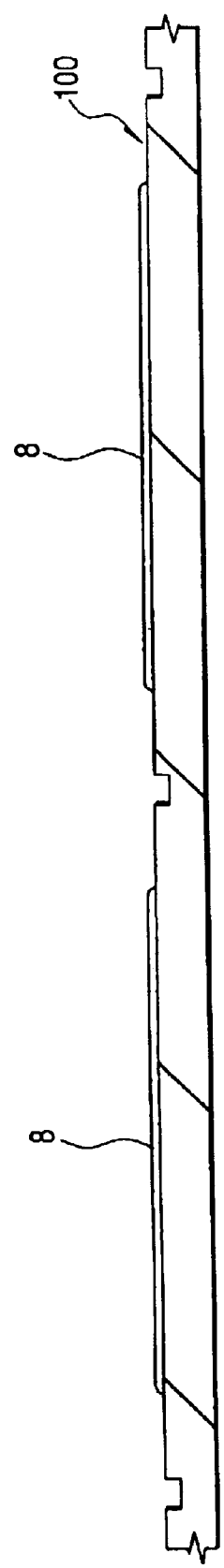
FIG. 15 is a sectional view showing a state where an adhesive is applied to respective chip-mounting regions of the top surface of the multi-wiring board.

In mounting the chips 2A over the multi-wiring board 100, an adhesive 8 is first applied to respective chip-mounting regions of the top surface of the multi-wiring board 100 as shown in FIG. 15. For the adhesive 8, use is made of an adhesive of, for example, thermosetting resin series. Also, in place of the adhesive 8, a double-face adhesive tape or the like, cut to a size substantially identical to that of the chip 2A, may be pasted to the respective chip-mounting regions.

Figure 16:
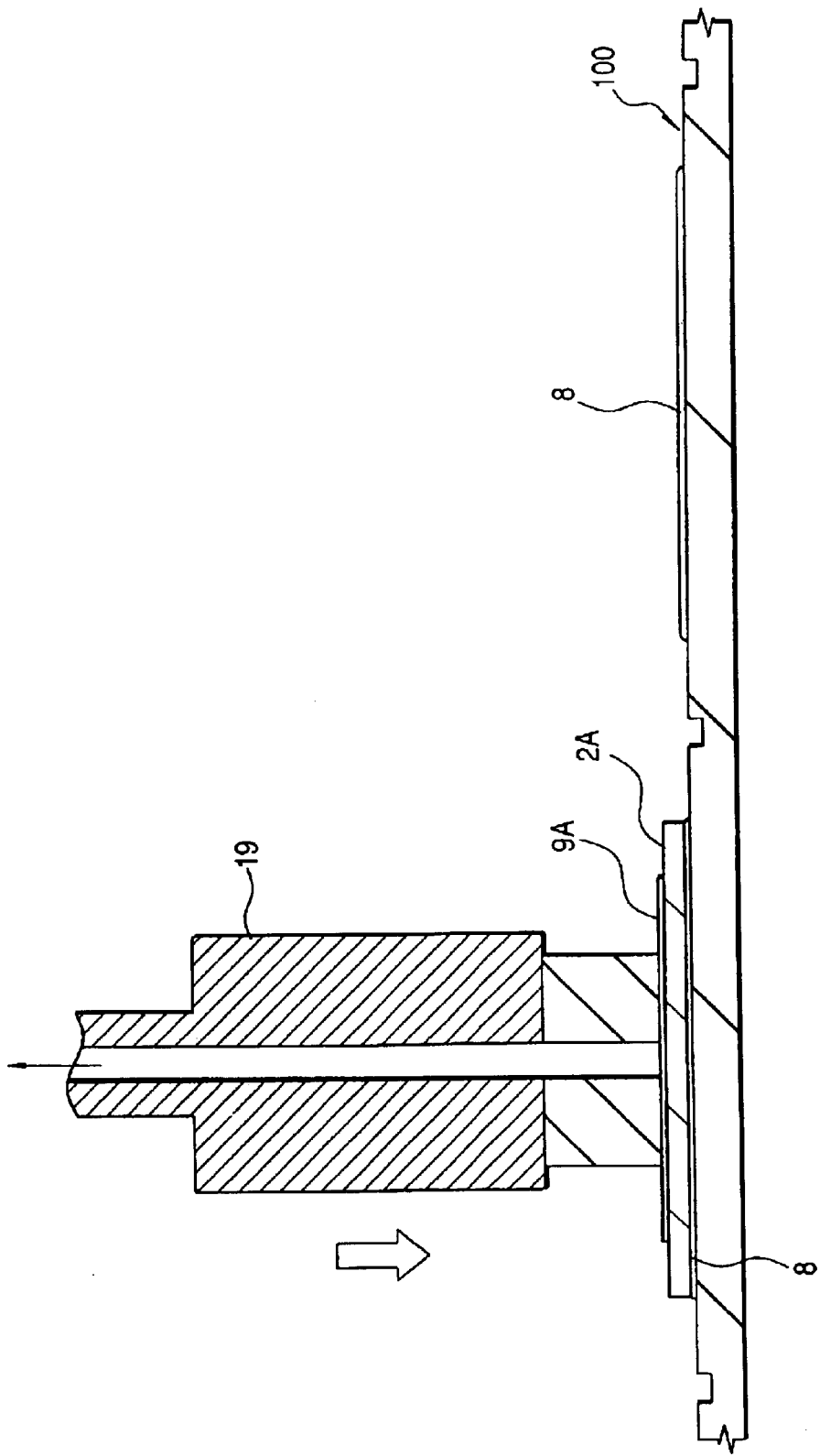
FIG. 16 is a sectional view showing the step of die bonding the semiconductor chip.
Figure 17:
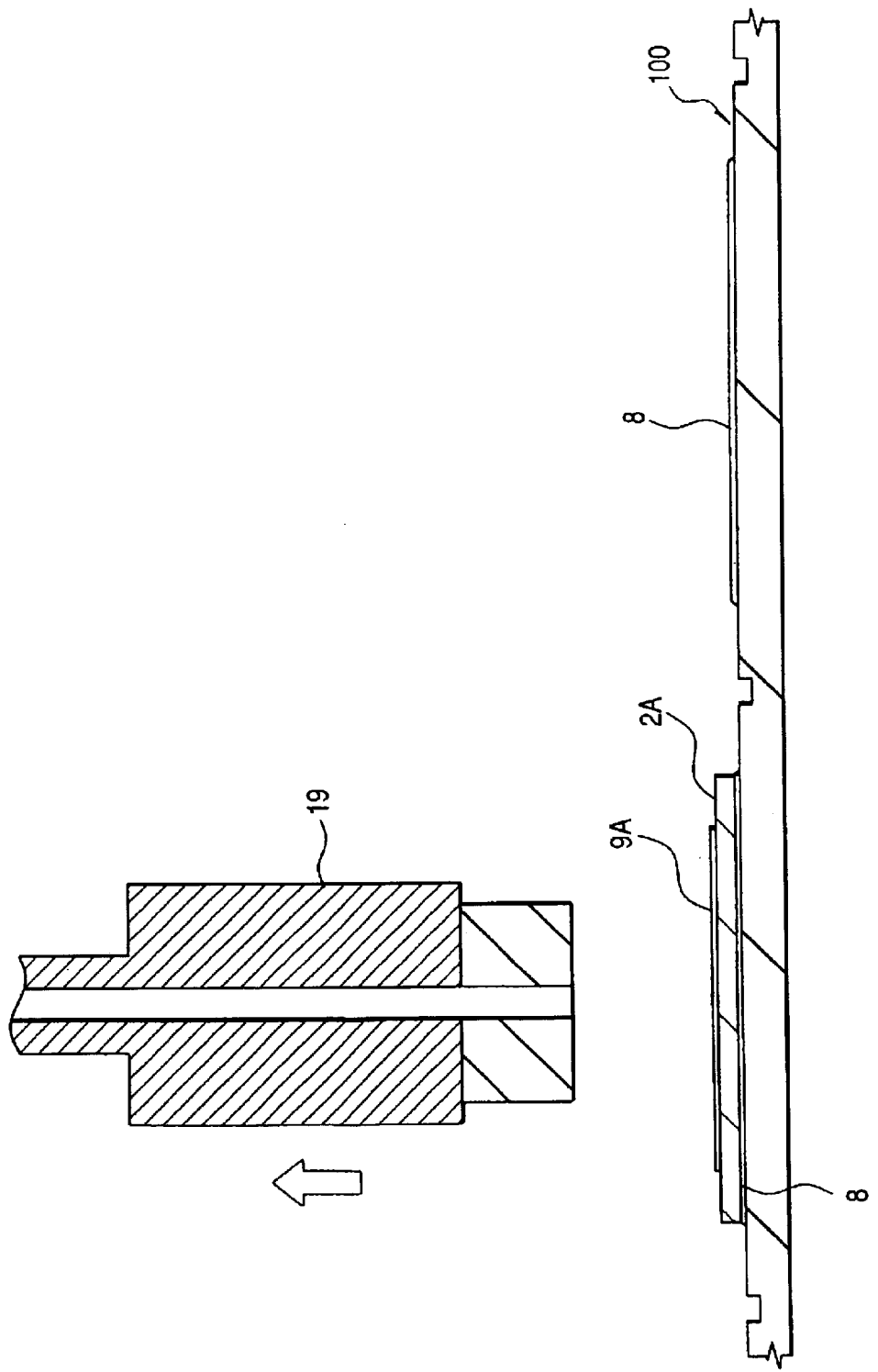
FIG. 17 is another sectional view showing the step of die bonding the semiconductor chip.

Next, die bonding of the chip 2A is executed by pressing the back surface (underside) of the chip 2A that is sucked and securely held by the contact collect 19 against one of the chip-mounting regions of the multi-wiring board 100 as shown FIG. 16, and subsequently, by disengaging the contact collect 19 from the chip 2A as shown in FIG. 17.

Figure 18:
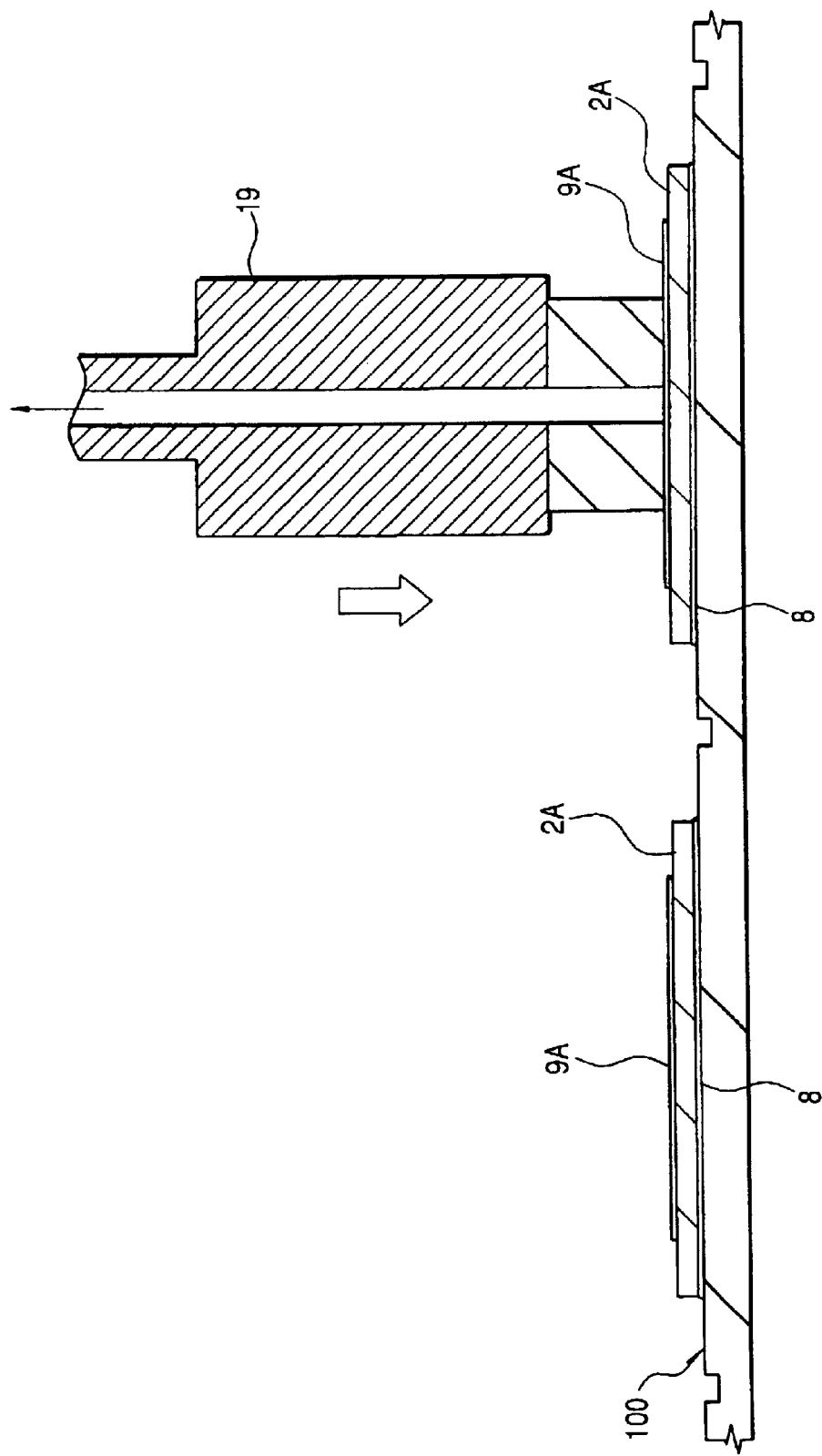
FIG. 18 is a sectional view showing the step of die bonding another semiconductor chip.
Figure 19:
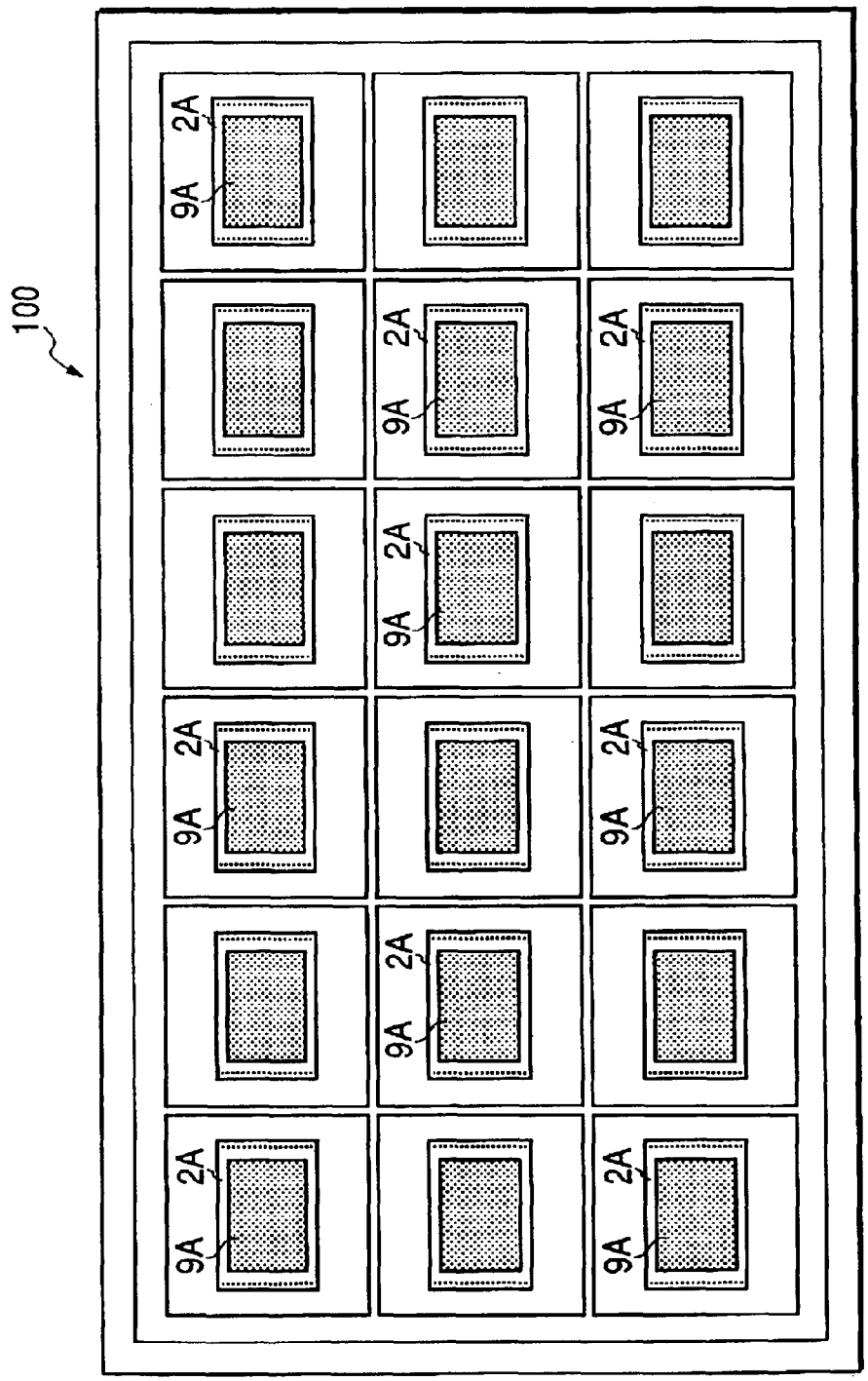
FIG. 19 is a plan view showing the step of die bonding the semiconductor chips.

Subsequently, as shown in FIG. 18, another chip 2A peeled off from the dicing tape 15 is pressed against another of the chip-mounting regions of the multi-wiring board 100 in the same manner as described above, thereby executing die bonding. Thus, as shown in FIG. 19, die bonding of the chips 2A peeled off from the dicing tape 15 is executed one by one in the respective chip-mounting regions of the multi-wiring board 100 to be followed by heating and curing of the adhesive 8, thereby completing the step of die bonding the chips 2A.

With the step of die bonding, if a minute foreign matter is interposed between the respective chips 2A and the contact collect 19 when the respective chips 2A bonded to the dicing tape 15, in a state as sucked and securely held by the contact collect 19, are transferred to the step of die bonding, there is the risk of the top surface of the respective chips 2A being marred by the foreign matter when the respective chips 2A sucked and securely held by the contact collect 19 are pressed against the multi-wiring board 100. With the present embodiment, however, since the protection tape 9A is pasted to the top surface of the respective chips 2A, there is no risk of the respective chips 2A themselves being marred even though the surface of the protection tape 9A might be marred. Accordingly, there is no risk of flash memory circuits formed over the top surface of the respective chips 2A suffering damage.

Figure 20:
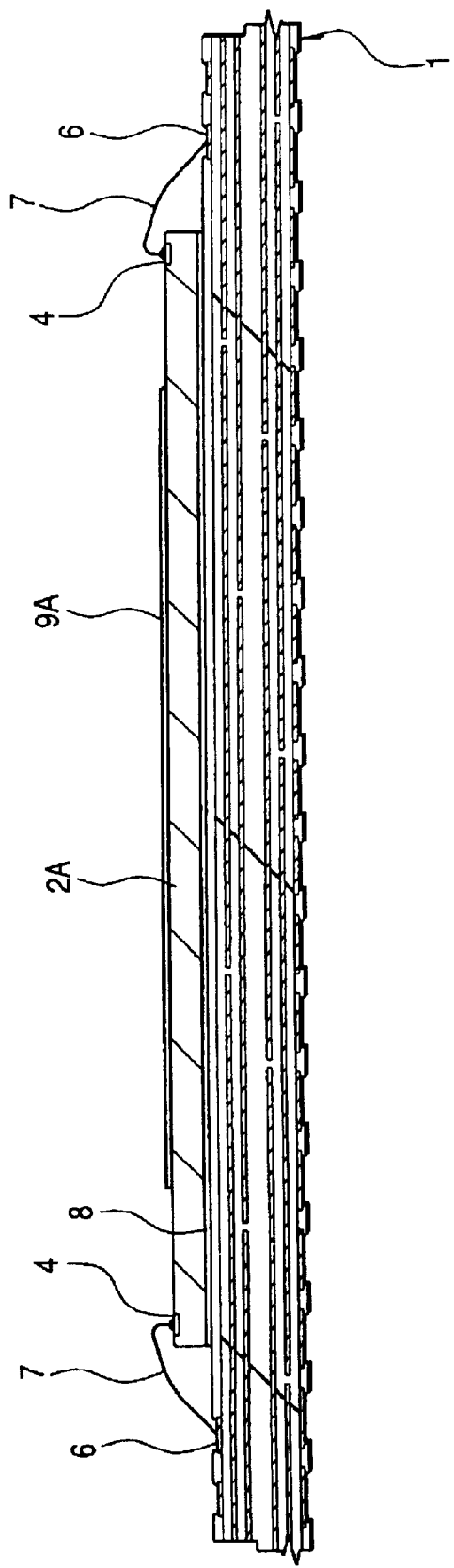
FIG. 20 is a sectional view showing the step of wire bonding the semiconductor chip.

Next, as shown in FIG. 20, the bonding pads 4 of the respective chips 2A are electrically connected to the wirings 6 of the multi-wiring board 100 via the Au wire 7, respectively. Connection via the Au wire 7 is implemented with the known wire bonder making use of ultrasonic vibration in combination with thermal compression bonding.

Thereafter, the second chip 2B is mounted over the respective chips 2A, mounted over the multi-wiring board 100, by the following method.

Figure 21:
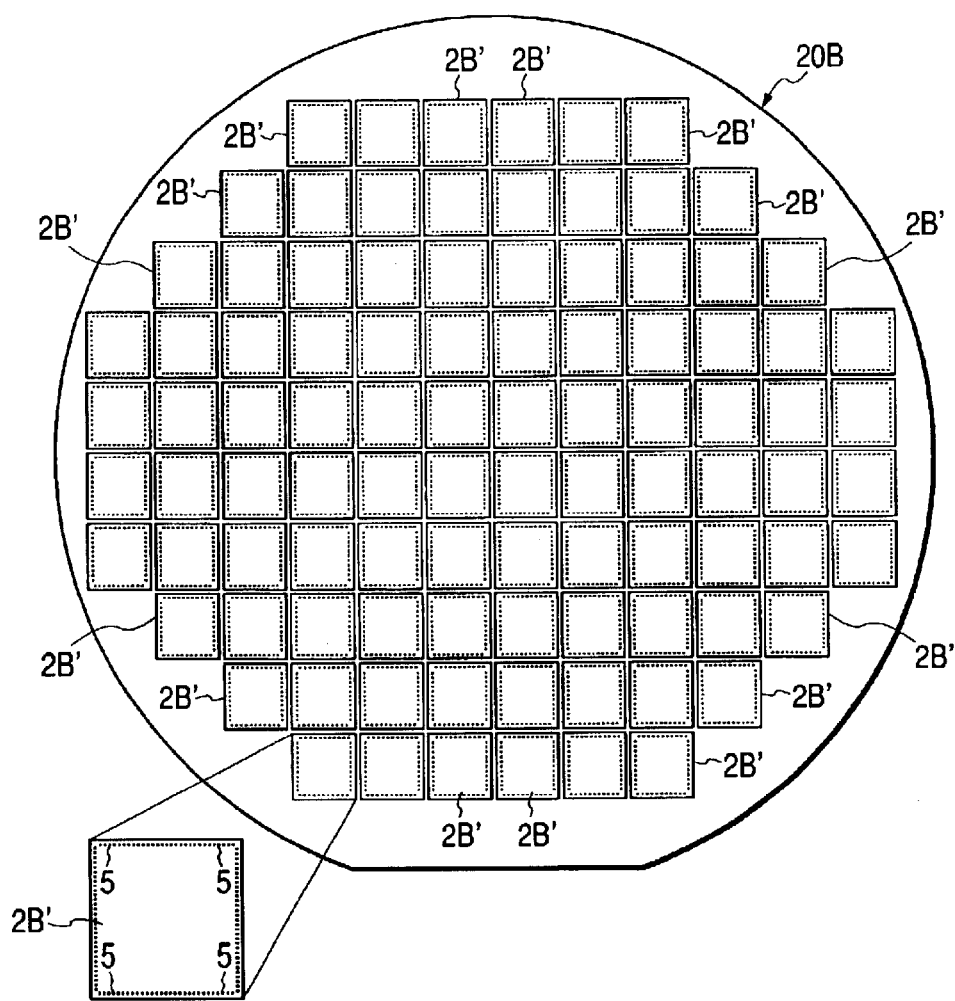
FIG. 21 is a plan view of the semiconductor wafer for use in carrying out the method of manufacturing the semiconductor device according to the embodiment of the invention.

After forming first the microprocessors (MPUs) over the top surface of a wafer 20B shown in FIG. 21 in accordance with the known manufacturing process, wafer inspection is conducted by tapping a probe on the bonding pads 5 in respective chip-forming regions 2B', respectively, thereby inspecting the respective chip-forming regions 2B' to sort out defectives from conforming workpieces.

Figure 22:
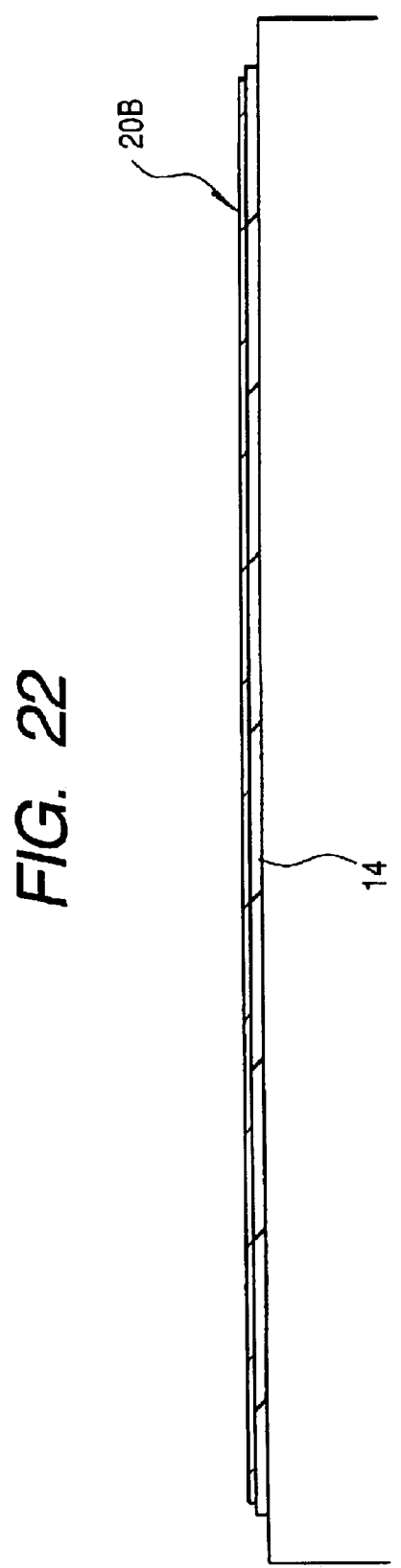
FIG. 22 is a sectional view showing the step of grinding the back surface of the semiconductor wafer.

Next, as shown in FIG. 22, the back surface of the wafer 20B, with a back-grind tape 14 for protection, pasted to the top surface thereof, is ground by the previously described method, thereby reducing the thickness of the wafer 20B to about 50 to 90 µm.

Figure 23:
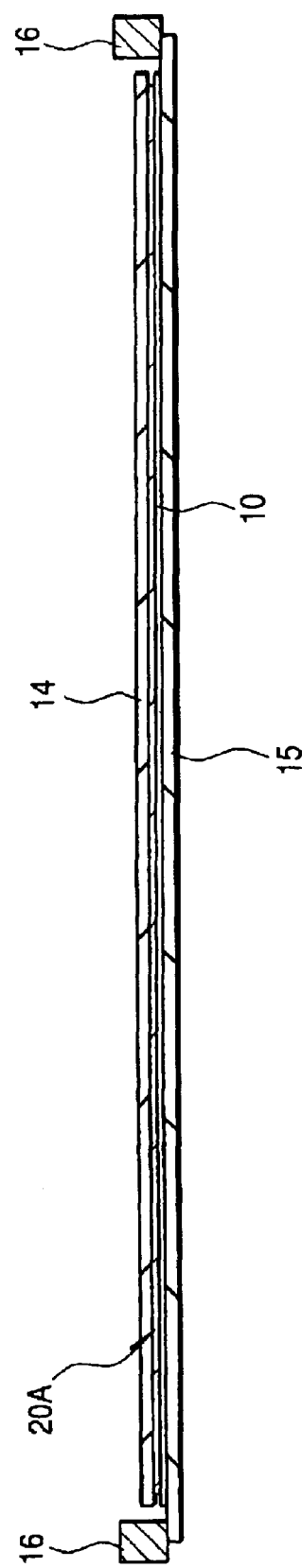
FIG. 23 is a sectional view showing a state where a dicing tape is pasted to the back surface of the semiconductor wafer, and are fixedly attached to a carrier jig.

Subsequently, as shown in FIG. 23, a die-bonding film 10 is pasted to the back surface of the wafer 20B with the back-grind tape 14 kept intact on the top surface of the wafer 20B, and further, a dicing tape 15 is pasted to the back surface of the die-bonding film 10. At the same time, the periphery of the dicing tape 15 is bonded to, and fixedly attached to a carrier jig 16. The die-bonding film 10 pasted to the back surface of the wafer 20B is made of a double-faced adhesive tape of a size substantially identical to that of the wafer 20B, and is intended to serve as an adhesive when mounting the chip 2B over the respective chips 2A in a later step.

Figure 24:
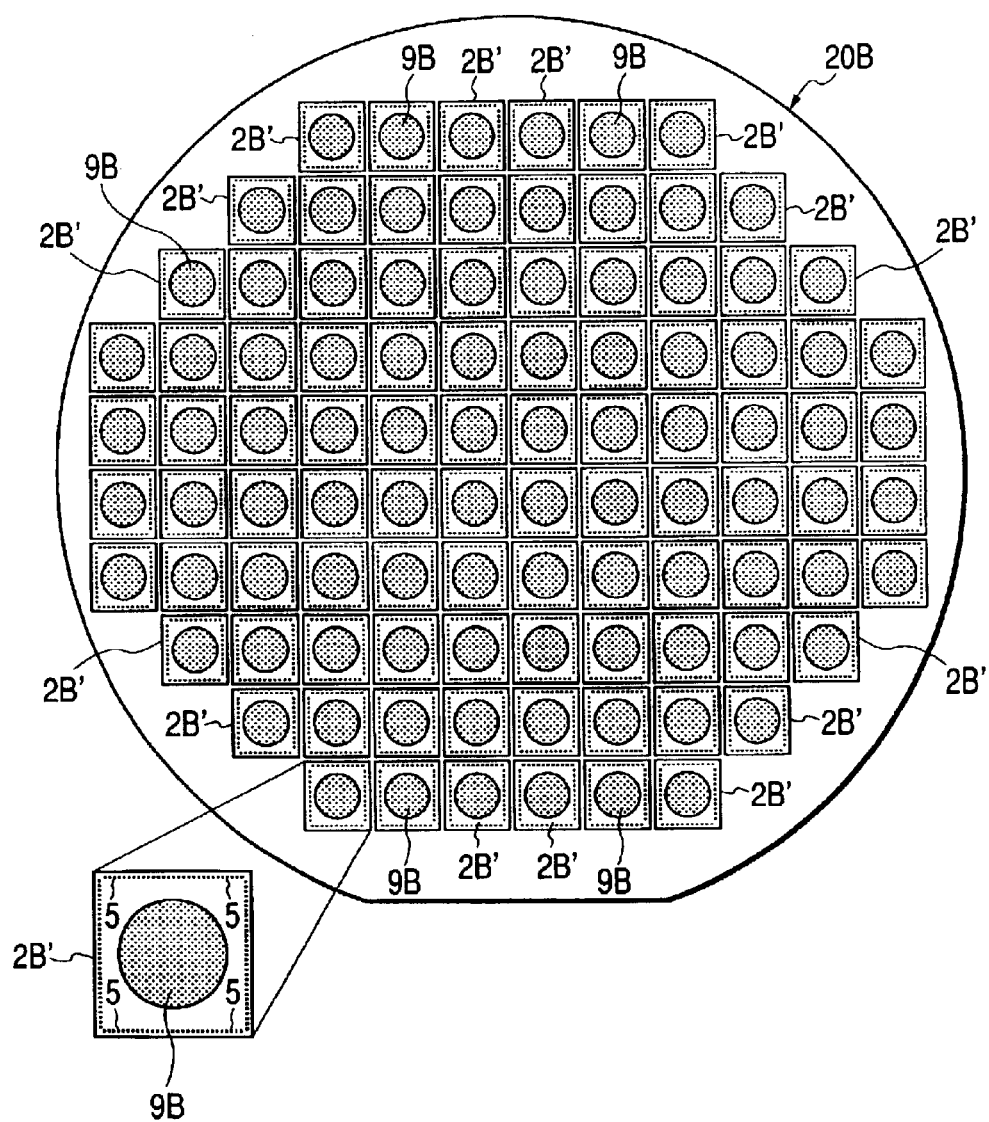
FIG. 24 is plan view showing a state where a protection film is formed over the top surface of the semiconductor wafer.

Next, after peeling off the back-grind tape 14 from the top surface of the wafer 20B, the protection film 9B is formed over the top surface of respective chip-forming regions 2B' as shown in FIG. 24. The protection film 9B is provided in order to prevent the contact collet 19 for use when transferring and die-bonding the respective chips 2B in later steps from coming in direct contact with the top surface of the respective chips 2B, and is made of a thin film on the order of 10 to 50 µm in thickness, formed by dissolving, for example, a polyimide resin, an epoxy resin, silicone resin, bismaleimido-triazine resin, or a mixed resin made of not less than two kinds selected from the group consisting of the foregoing resins, and so forth, into a solvent to be potted over the respective chip-forming regions 2B', and subsequently, by heating and curing the resin. As for the shape of the protection film 9B, any suitable shape may be adopted provided that the same can prevent direct contact of the contact collet 19 with the respective chips 2B, and does not cover the respective surfaces of the bonding pads 5. Further, as for the constituent material of the protection film 9B, various materials may be adopted provided that the same serves the above-described purpose.

As with the case of the protection tape 9A, the protection film 9B may be made of an insulating material that is worked into a thin film on the order of 10 to 50 µm in thickness with an adhesive coated on one side thereof. Further, as with the case of the protection tape 9A, the protection film 9B may be formed over the respective chip-forming regions 2B' immediately after the wafer inspection for inspecting the chip-forming regions 2B' formed in the wafer 20B to sort out defectives from conforming workpieces. Thereupon, if the protection film 9B is pasted only to the top surface of the chip-forming regions 2B' that are determined as the conforming workpieces at the time of the wafer inspection, this will enable the protection film 9B to have a function serving as a mark for the conforming workpiece, so that time and effort required for separately preparing the mark for the conforming workpiece can be eliminated.

Figure 25:
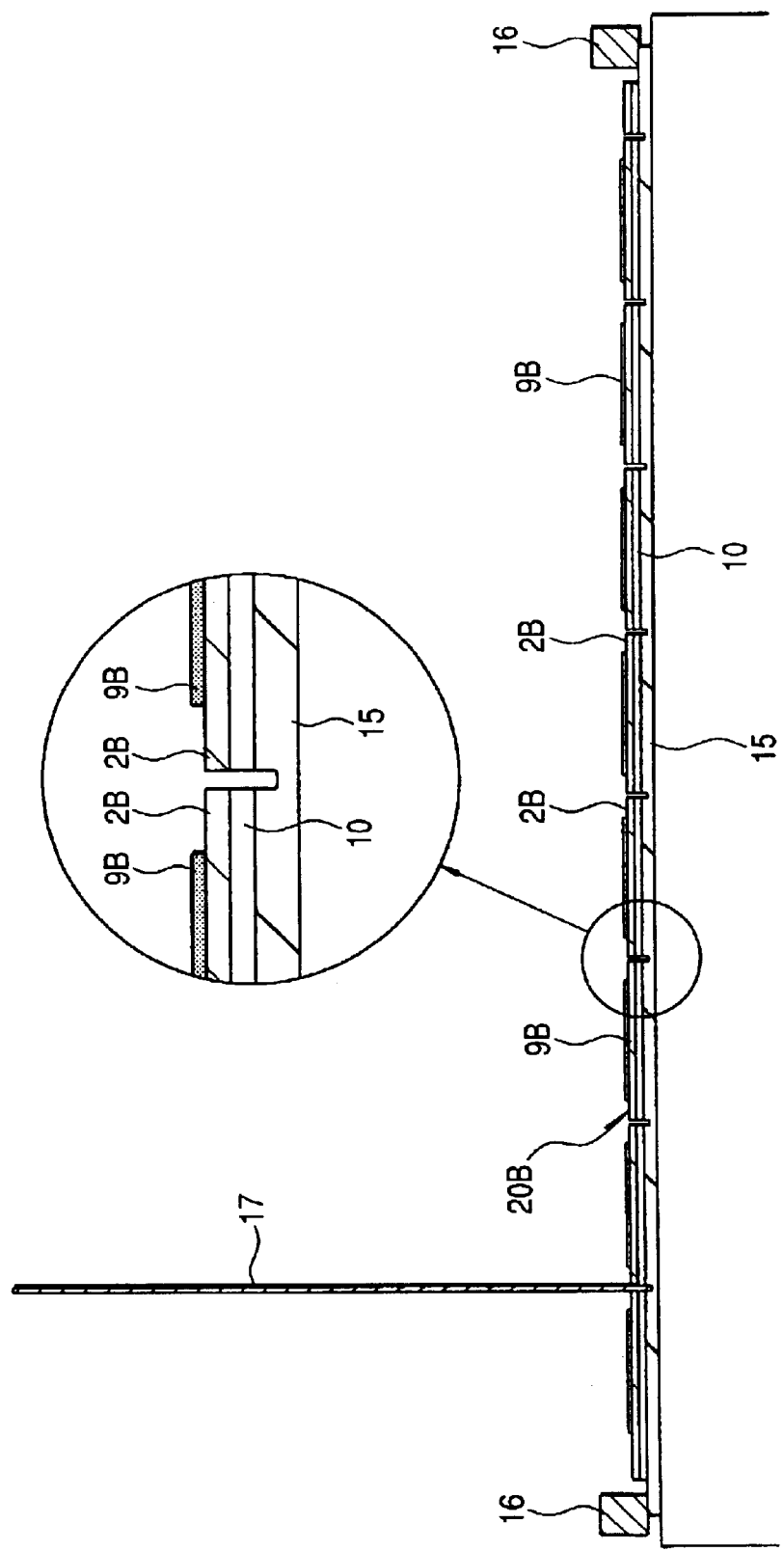
FIG. 25 is a sectional view showing the step of dicing the semiconductor wafer.

Next, as shown in FIG. 25, by dicing the wafer 20B and the die-bonding film 10 pasted to the back surface thereof with a diamond blade 17 or the like, the chips 2B are separated into pieces. At this point in time, the dicing tape 15 is not completely cut (that is, half cut) so as to keep the respective chips 2B that are separated into pieces fixedly attached to a carrier jig 16. Thereafter, the dicing tape 15 is irradiated with ultraviolet rays so as to cause an adhesive applied to the dicing tape 15 to be cured in order to facilitate peeling-off of the respective chips 2B from the dicing tape 15.

Figure 26:
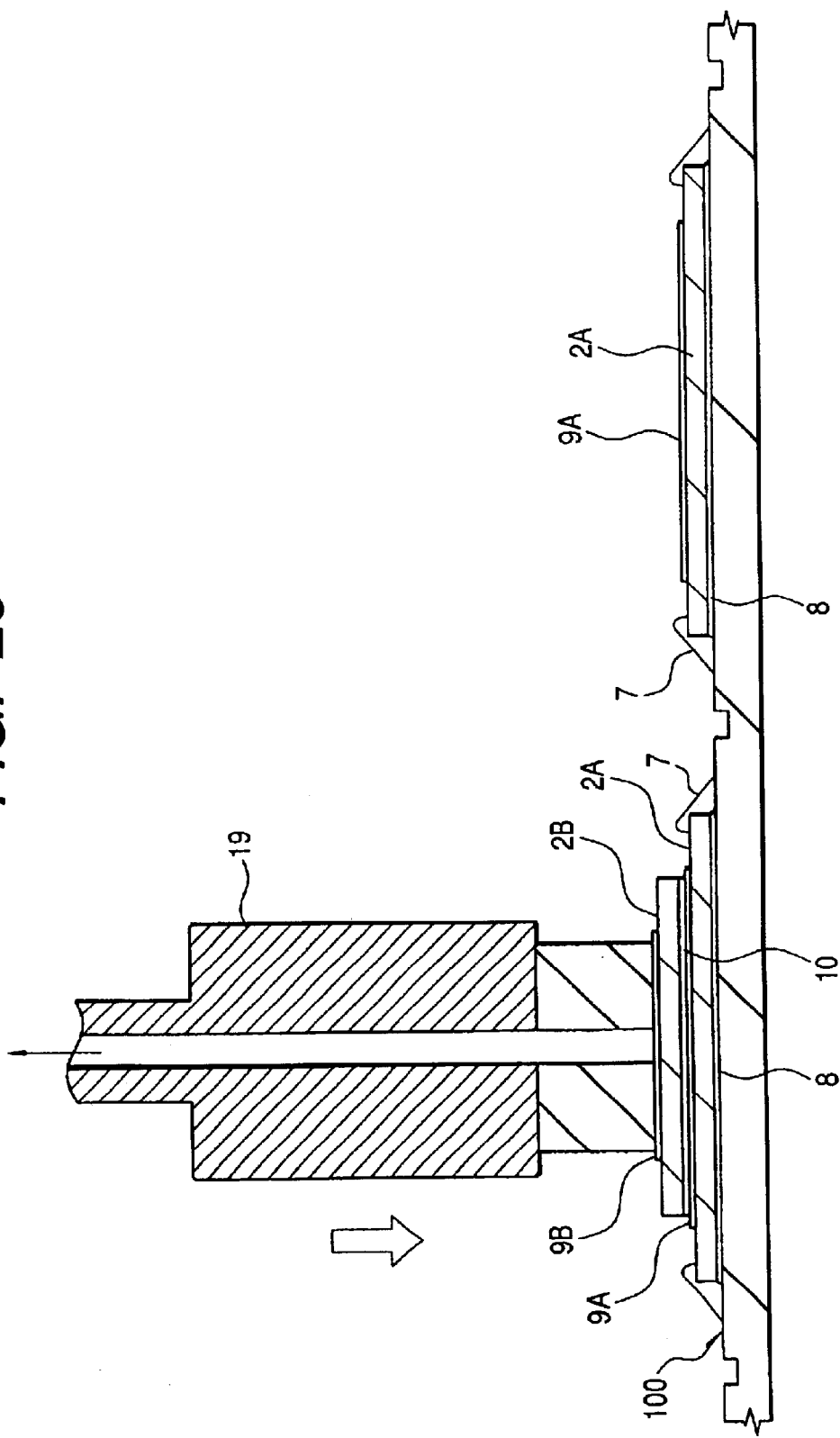
FIG. 26 is a sectional view showing the step of die bonding a second semiconductor chip.

Subsequently, by securely holding the top surface side of the respective chips 2B through vacuum suction with the contact collet 19 by the previously described method, the respective chips 2B and the die-bonding film 10 pasted to the back surface thereof are peeled off from the dicing tape 15 to be transferred to the subsequent step of die bonding. Then, by pressing the back surface (underside) of the respective chips 2B sucked and securely held by the contact collet 19 against the top surface of the respective chips 2A mounted over the multi-wiring board 100, as shown in FIG. 26, and subsequently, by disengaging the contact collet 19 from the chip 2B, die bonding of the respective chips 2B is implemented. As a result, the chip 2B is bonded over the top surface of the respective chips 2A with the die-bonding film 10 pasted to the back surface of the chip 2B, interposed therebetween.

By die bonding the chip 2B peeled off from the dicing tape 15, one by one, over the respective chips 2A of the multi-wiring board 100 in this way, the step of die bonding the chips 2B is completed.

With the step of die bonding, if a minute foreign matter is interposed between the respective chips 2B and the contact collet 19 when the respective chips 2B bonded to the dicing tape 15, in a state as sucked and securely held by the contact collet 19, are transferred to the step of die bonding, there is the risk of the top surface of the respective chips 2B being marred with the foreign matter when the respective chips 2B sucked and securely held by the contact collet 19 are pressed against the multi-wiring board 100. With the present embodiment, however, since the protection film 9B is applied to the top surface of the respective chips 2B, there is no risk of the respective chips 2B themselves being marred even though the surface of the protection film 9B might be marred. Accordingly, there is no risk of microprocessor (MPU) circuits formed over the top surface of the respective chips 2B suffering damage.

Figure 27:
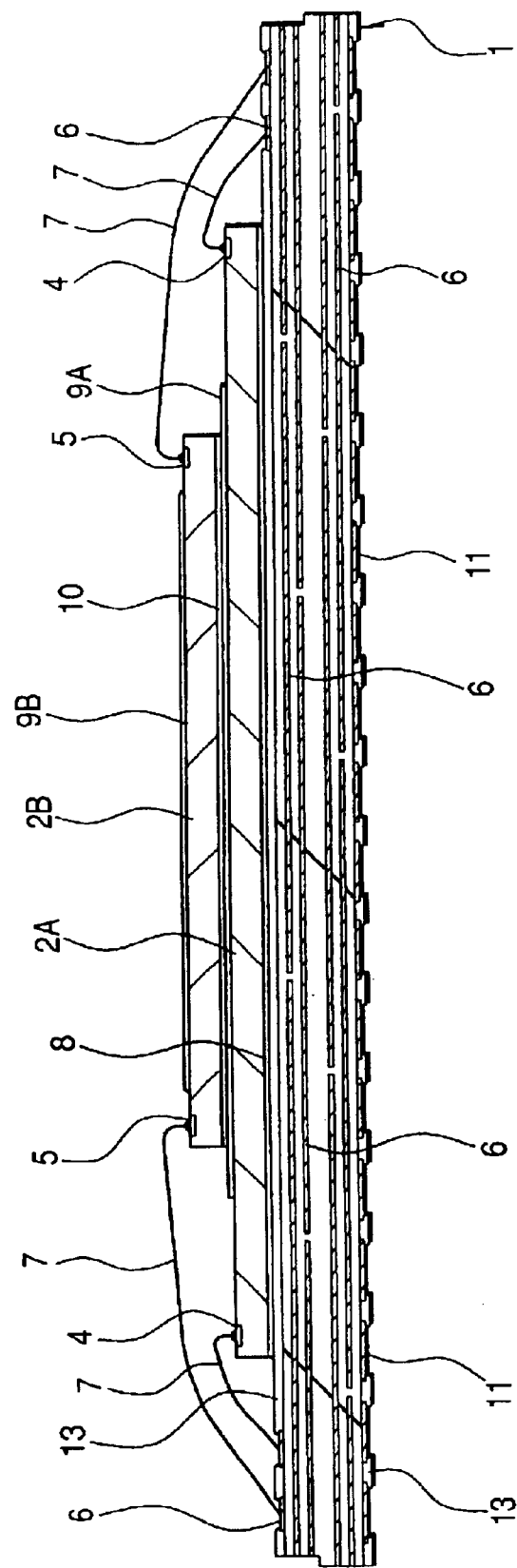
FIG. 27 is a sectional view showing the step of wire bonding the second semiconductor chip.
Figure 28:
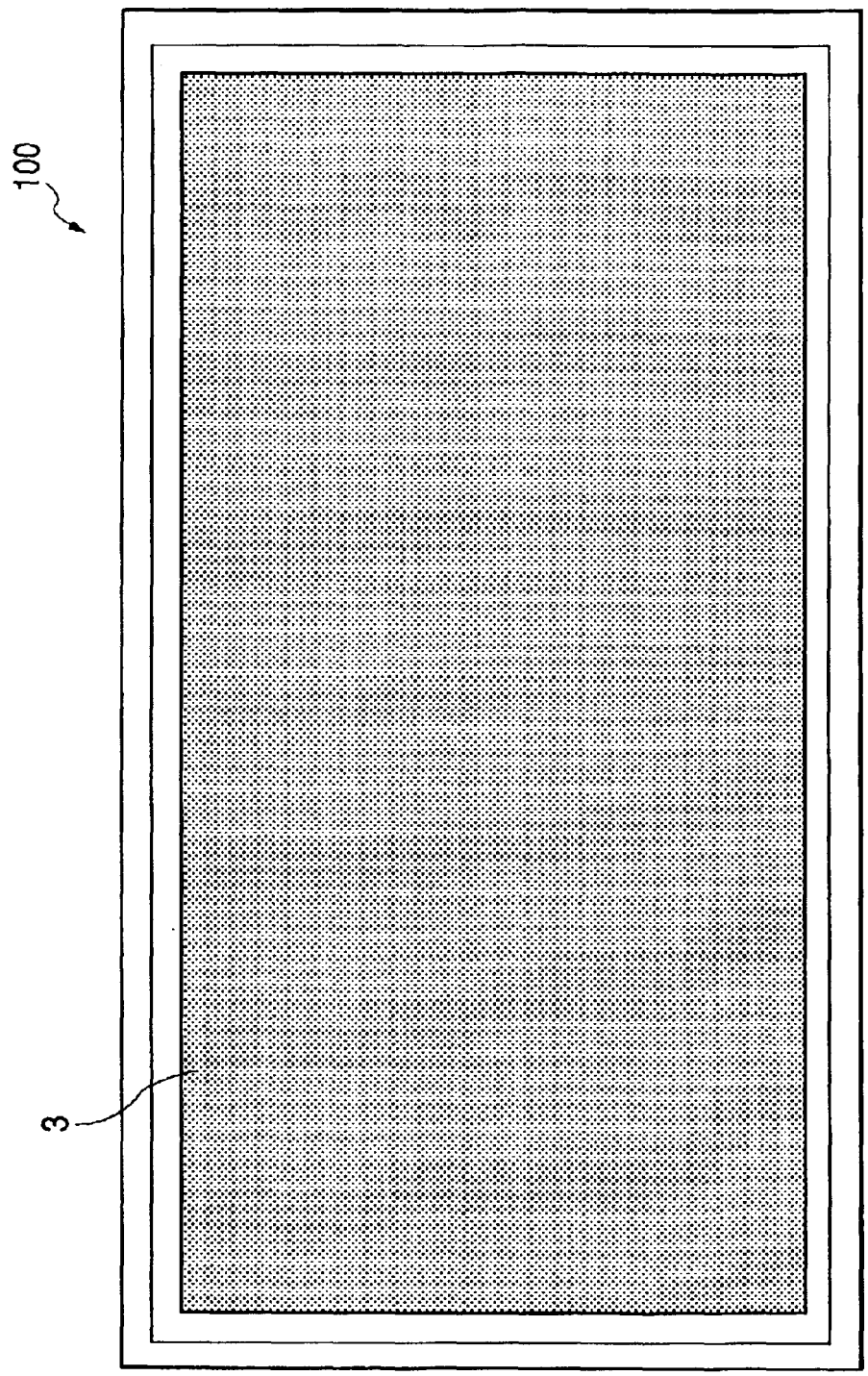
FIG. 28 is a plan view showing the step of fully sealing the semiconductor chips with resin.

Next, after connecting the bonding pads 5 of the respective chips 2B to the wirings 6 of the multi-wiring board 100 via the Au wire 7, respectively, as shown in FIG. 27, the whole top surface of the multi-wiring board 100 is fully sealed with resin, as shown in FIG. 28, by use of a molding die (not shown). A molding resin 3 for sealing the top surface of the multi-wiring board 100 is made of, for example, a thermosetting type epoxy resin with silica, on the order of 70 to 100 µm in particle size, dispersed therein.

Figure 29:
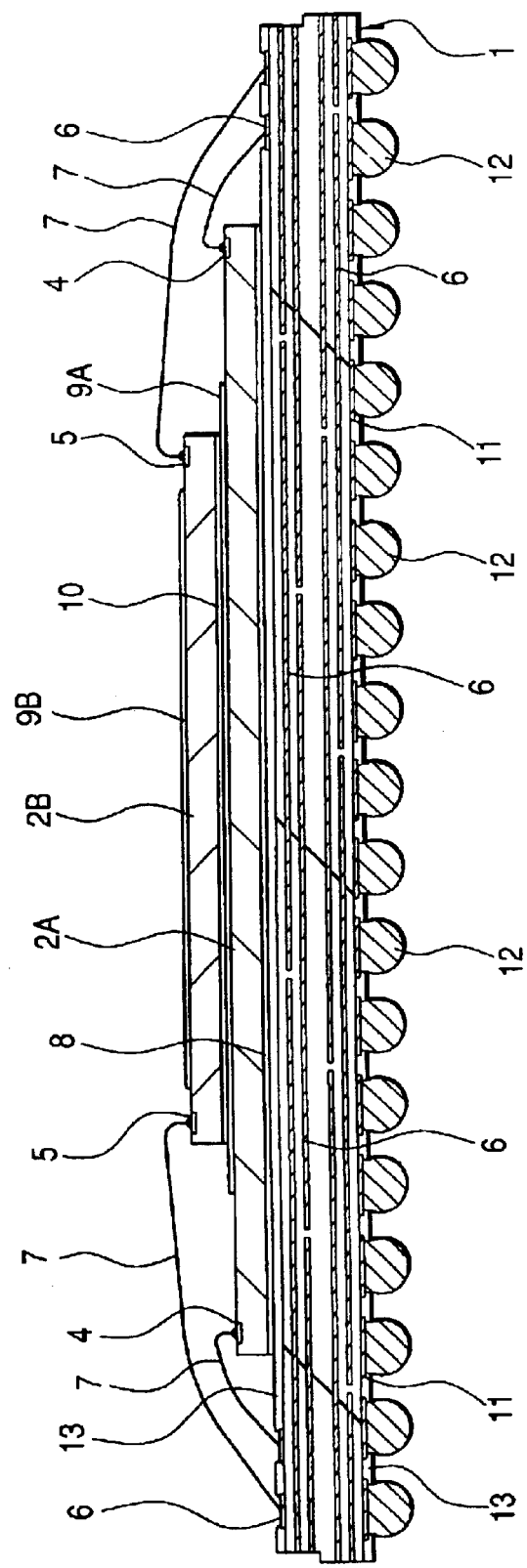
FIG. 29 is a sectional view showing a state where a solder bump is connected to respective electrode pads provided on the back surface of the multi-wiring board.

Subsequently, as shown in FIG. 29, a solder bump 12 is connected to respective electrode pads 11 provided on the back surface of the multi-wiring board 100. Connection of the solder bumps 12 is implemented by supplying first a solder ball made of, for example, a Pb—Sn eutectic alloy having a low melting point to the surface of the respective electrode pads 11, and subsequently, by causing reflow of the solder ball.

Figure 14:
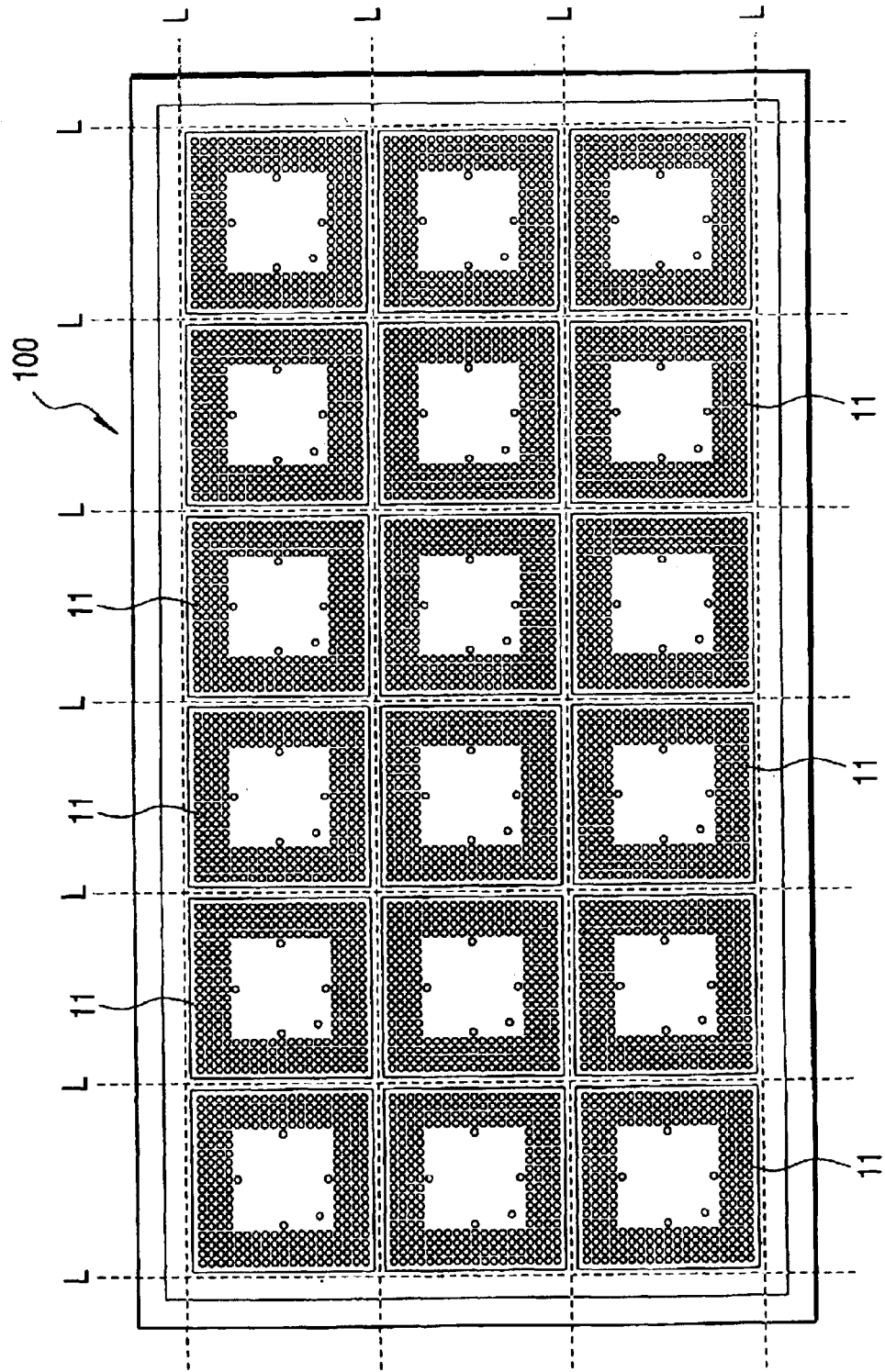
FIG. 14 is another plan view of the multi-wiring board for use in carrying out the method of manufacturing the semiconductor device according to the embodiment of the invention.

Thereafter, the multi-wiring board 100 is cut, and separated into pieces along the scribe lines L, shown in FIGS. 13 and 14, respectively, thereby completing the multi-chip module (MCM) according to the present embodiment, as shown in FIGS. 1 and 2.

As described hereinbefore, with the present embodiment of the invention, due to the formation of the protection tape 9A on the top surface of the chip 2A, and the protection film 9B on the top surface of the chip 2B, it becomes possible to ensure prevention of occurrence of damage to the respective top surfaces of the chips 2A, 2B when transferring and die bonding the chips 2A, 2B, respectively, with the use of the contact collect 19, so that a manufacturing yield of the multi-chip module (MCM) is improved.

Further, with the present embodiment, it is also possible to omit the step of applying further an organic protection film made of a polyimide or so forth on top of a surface protection film (passivation film) made of an inorganic insulating material made of silicon oxide, silicon nitride, or so forth, covering the respective top surfaces of the chips 2A, and 2B. As a result, it becomes possible to eliminate a photo mask for use in exposing the bonding pads by etching the organic protection film applied over the respective top surfaces of the chips 2A, and 2B, so that the manufacturing cost of the chips 2A, and 2B, respectively, can be reduced.

Still further, with the present embodiment, since the suction head 19a of the contact collect 19 can be formed of an inexpensive material such as a soft synthetic rubber, the manufacturing cost of the contact collect can be reduced, leading to reduction in the manufacturing cost of the multi-chip module (MCM).

As described in the foregoing, the invention developed by the inventor is described in specific terms based on the embodiment described above, however, it will be obvious to those skilled in the art that the scope of the invention is not limited thereto, and various changes and modifications may be made without departing from the spirit of the invention.

With the present embodiment, a case of applying the invention to the manufacture of the layered multi-chip module (MCM) is described herein, however, it is to be understood that the invention is not limited thereto, but is suitable for widespread use in the manufacture of a semiconductor device, comprising die bonding of chips over various wiring boards or lead frames by use of the contact collet.

Among various embodiments of the invention as disclosed by the present application, the advantageous effect of a representative one is described in simple terms as follows.

By forming a protection layer over the top surface of a chip, it becomes possible to ensure prevention of problems of damage otherwise occurring to the top surface of the chip when transferring and die bonding the chip with the use of a contact colllect.

What is claimed is:

1. A method of manufacturing a semiconductor device, comprising the steps of:
   (a) inspecting a plurality of semiconductor chips on a semiconductor wafer thereby sorting out defectives from conforming ones thereof;
   (b) separating the plurality of semiconductor chips into pieces by dicing the semiconductor wafer with the top surface thereof, partitioned into a plurality of semiconductor chip-forming regions;
   (c) preparing a contact collect with a suction head coming in contact with the top surface of the respective semiconductor chips, smaller in surface area than the respective semiconductor chips, and sucking and securely holding the respective semiconductor chips separated into pieces with the contact collect by abutting the suction head of the contact collect against the top surface of the respective semiconductor chips separated into pieces;
   (d) executing die bonding of the respective semiconductor chips over a top surface of a mounting base by pressing the back surface of the respective semiconductor chips sucked and securely held by the contact collect against the top surface of the mounting base; and
   (e) connecting bonding pads formed over the top surface of the respective semiconductor chips to conductor layers formed over the top surface of the mounting base via a wire, respectively,
   wherein a protection layer for preventing direct contact of the suction head of the contact collect with the top surface of the respective semiconductor chips is provided over the top surface of the respective semiconductor chips prior to sucking and securely holding the respective semiconductor chips with the contact collect, and
   wherein only the semiconductor chips that are determined as the conforming ones at inspection are provided with the protection layer.

2. A method of manufacturing a semiconductor device according to claim 1, wherein the protection layer is made of an insulating tape bonded to the top surface of the respective semiconductor chips.

3. A method of manufacturing a semiconductor device according to claim 1, wherein the protection layer is made of an insulating film pasted to the top surface of the respective semiconductor chips.

4. A method of manufacturing a semiconductor device according to claim 1, wherein the protection layer does not cover a surface of the bonding pads formed over the top surface of the respective semiconductor chips.

5. A method of manufacturing a semiconductor device according to claim 1, wherein the suction head of the contact collect is formed of a synthetic rubber as the main constituent material thereof.

6. A method of manufacturing a semiconductor device according to claim 1, further comprising, after the step (e), a step of sealing the respective semiconductor chips with resin while keeping the protection layer left intact on the top surface of the respective semiconductor chips.

7. A method of manufacturing a semiconductor device according to claim 1, wherein the topmost layer of the top surface of the respective semiconductor chips is covered by a surface protection film made of an inorganic insulating material, and the protection layer is provided over the surface protection film.

8. A method of manufacturing a semiconductor device, comprising the steps of:
   (a) inspecting a plurality of semiconductor chips on first and second semiconductor wafers thereby sorting out defectives from conforming ones thereof;
   (b) separating a plurality of first semiconductor chips into pieces by dicing the first semiconductor wafer with the top surface thereof, partitioned into a plurality of first semiconductor chip-forming regions;
   (c) separating a plurality of second semiconductor chips into pieces by dicing the second semiconductor wafer with the top surface thereof, partitioned into a plurality of second semiconductor chip-forming regions;
   (d) preparing a first contact collect with a suction head coming in contact with the top surface of the respective first semiconductor chips, smaller in surface area than the respective first semiconductor chips, and sucking and securely holding the respective first semiconductor chips separated into pieces with the first contact collect by abutting the suction head of the first contact collect against the top surface of the respective first semiconductor chips separated into pieces;
   (e) executing die bonding of the respective first semiconductor chips over a top surface of a mounting base by pressing the back surface of the respective first semiconductor chips sucked and securely held by the first contact collect against the top surface of the mounting base;
   (f) preparing a second contact collect with a suction head coming in contact with the top surface of the respective second semiconductor chips, smaller in surface area than the respective second semiconductor chips, and sucking and securely holding the respective second semiconductor chips separated into pieces with the second contact collect by abutting the suction head of the second contact collect against the top surface of the respective second semiconductor chips separated into pieces; and (g) executing die bonding of the second semiconductor chip over the top surface of the respective first semiconductor chips by pressing the back surface of the second semiconductor chip sucked and securely held by the second contact collect against the top surface of the respective first semiconductor chips that are die-bonded on the top surface of the mounting base, wherein a first protection layer for preventing direct contact of the suction head of the first contact collect with the top surface of the respective first semiconductor chips is provided over the top surface of the respective first semiconductor chips prior to sucking and securely holding the respective first semiconductor chips with the first contact collect and a second protection layer for preventing direct contact of the suction head of the second contact collect with the top surface of the respective second semiconductor chips is provided over the top surface of the respective second semiconductor chips prior to sucking and securely holding the respective second semiconductor chips with the second contact collect, and wherein only the semiconductor chips that are determined as the conforming ones at inspection are provided with the first or second protection layer.

9. A method of manufacturing a semiconductor device according to claim 8, wherein the topmost layer of the respective top surfaces of the first and second semiconductor chips is covered by a surface protection film made of an inorganic insulating material, and the first and second protection layers are provided over the respective surface protection films.

10. A method of manufacturing a semiconductor device according to claim 8, wherein the dicing of the second semiconductor wafer is executed in a state where a die-bonding film is bonded to the back surface of the respective second semiconductor chips, and the respective second semiconductor chips are bonded to the top surface of the respective first semiconductor chips through the intermediary of the die-bonding film.

11. A method of manufacturing a semiconductor device according to claim 8, further comprising the steps of:

first wire-bonding to connect bonding pads formed over the top surface of the respective first semiconductor chips to conductor layers formed over the top surface of the mounting base via a wire, respectively, after the step (e) and prior to the step (g); and second wire-bonding to connect bonding pads formed over the top surface of the respective second semiconductor chips to conductor layers formed over the top surface of the mounting base via a wire, respectively, after the step (g).

12. A method of manufacturing a semiconductor device according to claim 11, further comprising a step of sealing the first and second semiconductor chips with resin after the second wire-bonding.

13. A method of manufacturing a semiconductor device according to claim 8, further comprising a step of reducing the thickness of the first semiconductor wafer by grinding the back surface thereof prior to the step (b), and a step of reducing the thickness of the second semiconductor wafer by grinding the back surface thereof prior to the step (c).

14. A method of manufacturing a semiconductor device, comprising preparing semiconductor chips and mounting the semiconductor chips over a mounting base after preparing the semiconductor chips, the step of preparing the semiconductor chips, comprising the steps of:

(a) preparing a semiconductor wafer having a top surface with integrated circuits and a plurality of bonding pads, formed thereover, and a back surface opposite to the top surface, the top surface being partitioned into a plurality of semiconductor chip-forming regions by scribe lines;

(b) reducing the thickness of the semiconductor wafer by grinding the back surface thereof;

(c) forming a plurality of the semiconductor chips by cutting the semiconductor wafer along the scribe lines;

(d) inspecting the plurality of semiconductor chips on the semiconductor wafer thereby sorting out defectives from conforming ones thereof; and (e) forming a protection layer only over the respective top surfaces of the semiconductor chips that are determined as the conforming ones at inspection, and the step of mounting the semiconductor chips over the mounting base, comprising:

(f) preparing a contact collect with a suction head smaller in surface area than the respective semiconductor chips, and securely holding the respective semiconductor chips with the contact collect by abutting the suction head of the contact collect against the protection layer formed over the top surface of the respective semiconductor chips; and (g) pressing the back surface of the respective semiconductor chips securely held by the contact collect against the top surface of the mounting base and bonding the respective semiconductor chips to the top surface of the mounting base.

15. A method of manufacturing a semiconductor device according to claim 14, wherein the respective semiconductor chips are provided with an insulating film formed prior to the step (e), covering the top surface of the respective semiconductor chips while exposing the plurality of the bonding pads, and the thickness of the protection layer is larger than that of the insulating film.

16. A method of manufacturing a semiconductor device according to claim 14, wherein the mounting base is provided with a plurality of wiring layers and a plurality of electrodes connected to the plurality of the wiring layers, respectively, the method further comprising a step of (h) connecting the plurality of the electrodes of the mounting base to the plurality of the bonding pads of the respective semiconductor chips via wire, respectively, after the step (g).

17. A method of manufacturing a semiconductor device according to claim 16, further comprising a step of (i) sealing the top surface of the mounting base including the respective semiconductor chips, the wire, and the plurality of the electrodes of the mounting base, with resin after the step (h).

* * * * *